(12) United States Patent
Kakimoto et al.

(10) Patent No.: US 9,777,366 B2
(45) Date of Patent: Oct. 3, 2017

(54) THIN FILM FORMING METHOD

(71) Applicant: TOKYO ELECTRON LIMITED, Tokyo (JP)

(72) Inventors: Akinobu Kakimoto, Nirasaki (JP); Atsushi Endo, Nirasaki (JP); Takahiro Miyahara, Nirasaki (JP); Shigeru Nakajima, Nirasaki (JP); Satoshi Takagi, Nirasaki (JP); Kazumasa Igarashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 39 days.

(21) Appl. No.: 14/730,530

(22) Filed: Jun. 4, 2015

(65) Prior Publication Data
US 2015/0270126 A1 Sep. 24, 2015

Related U.S. Application Data

(62) Division of application No. 13/628,268, filed on Sep. 27, 2012.

(30) Foreign Application Priority Data

Sep. 30, 2011 (JP) .................................. 2011-217390
Nov. 2, 2011 (JP) .................................. 2011-240840

(51) Int. Cl.
*H01L 21/479* (2006.01)
*C23C 16/24* (2006.01)
(Continued)

(52) U.S. Cl.
CPC .......... *C23C 16/24* (2013.01); *C23C 16/0272* (2013.01); *C23C 16/045* (2013.01);
(Continued)

(58) Field of Classification Search
CPC .................................................. H01L 21/02126
See application file for complete search history.

(56) References Cited

U.S. PATENT DOCUMENTS 4,582,696 A * 4/1986 Crosbie ............... C01B 21/0685
423/344
6,066,872 A 5/2000 Okada et al.
(Continued)

FOREIGN PATENT DOCUMENTS

JP 61034928 2/1986
JP 05251357 9/1993
(Continued)

OTHER PUBLICATIONS

Vivek Subramanian et al., Optimization of Silicon-Germanium TFT's Through the Control of Amorphous Precursor Characteristics, IEEE Transactions on Electron Devices, 1998, pp. 1690-1695.

*Primary Examiner* — Zandra Smith
*Assistant Examiner* — Andre' C Stevenson
(74) *Attorney, Agent, or Firm* — Cantor Colburn LLP

(57) ABSTRACT

A thin film forming method which forms a seed film and an impurity-containing silicon film on a surface of an object to be processed in a processing container configured to be vacuum exhaustible, the thin film forming method includes: performing a first step which forms the seed film formed of a compound of silicon, carbon and nitrogen on the surface of the object by supplying a seed film raw material gas comprising an aminosilane-based gas into the processing container; and performing a second step which forms the impurity-containing silicon film in an amorphous state on the seed film by supplying a silane-based gas and an impurity-containing gas into the processing container.

1 Claim, 20 Drawing Sheets

(51) Int. Cl.
  *C30B 25/02* (2006.01)
  *C30B 29/06* (2006.01)
  *C23C 16/02* (2006.01)
  *C23C 16/04* (2006.01)
  *C23C 16/455* (2006.01)
  *H01L 21/02* (2006.01)
  *H01L 21/67* (2006.01)

(52) U.S. Cl.
  CPC ........ *C23C 16/45523* (2013.01); *C30B 25/02* (2013.01); *C30B 29/06* (2013.01); *H01L 21/02167* (2013.01); *H01L 21/02271* (2013.01); *H01L 21/02312* (2013.01); *H01L 21/67109* (2013.01)

(56) References Cited

U.S. PATENT DOCUMENTS

| | | | |
|---|---|---|---|
| 7,351,668 B2 | 4/2008 | Chou et al. | |
| 8,053,356 B2 * | 11/2011 | Chang | H01L 21/28556 257/754 |
| 8,431,494 B2 * | 4/2013 | Murakami | C23C 16/45523 257/E21.274 |
| 2004/0161893 A1 | 8/2004 | Thakur et al. | |
| 2006/0113580 A1 | 6/2006 | Cho et al. | |
| 2007/0066015 A1 | 3/2007 | Park et al. | |
| 2008/0022924 A1 | 1/2008 | Kim et al. | |
| 2008/0067568 A1 | 3/2008 | Abbasi et al. | |
| 2009/0074652 A1 | 3/2009 | Dussarrat | |
| 2009/0291232 A1 | 11/2009 | Washio et al. | |
| 2011/0006419 A1 | 1/2011 | Hirano | |
| 2011/0006919 A1 | 1/2011 | Lundberg et al. | |
| 2011/0207302 A1 | 8/2011 | Wang et al. | |
| 2011/0306204 A1 | 12/2011 | Bai et al. | |
| 2013/0052795 A1 | 2/2013 | Watanabe | |

FOREIGN PATENT DOCUMENTS

| | | |
|---|---|---|
| JP | 08153688 | 6/1996 |
| JP | 2008053605 | 3/2008 |
| JP | 2009170823 | 7/2009 |
| JP | 2011176095 | 9/2011 |
| JP | 2011216784 | 10/2011 |
| WO | 02065525 | 8/2002 |
| WO | 02080244 | 10/2002 |
| WO | 2008108754 | 9/2008 |

* cited by examiner

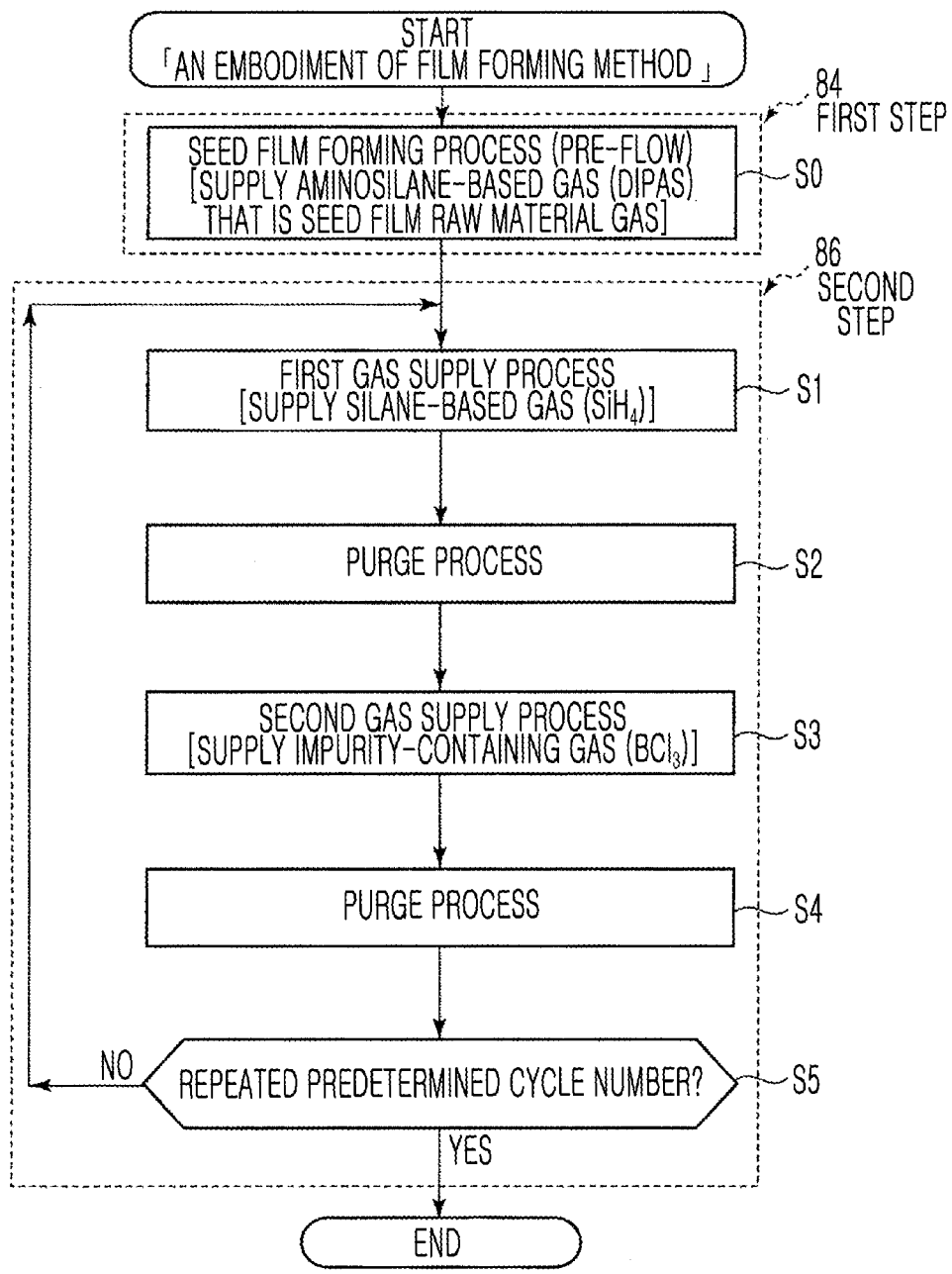

[+1.2eV]

[0.0eV]

<PART OF ANOTHER EMBODIMENT>

THIN FILM FORMING METHOD

CROSS-REFERENCE TO RELATED PATENT APPLICATIONS

This application is a divisional application of prior U.S. application Ser. No. 13/628,268, filed on Sep. 27, 2012, the entire contents of which are incorporated herein by reference, and this application claims the benefits of Japanese Patent Application No. 2011-217390, filed on Sep. 30, 2011 and Japanese Patent Application No. 2011-240840, filed on Nov. 2, 2011 in the Japan Patent Office, the disclosures of which are incorporated herein in its entirety by reference.

BACKGROUND OF THE INVENTION

1. Field of the Invention

The present invention relates to a film forming method and film forming apparatus, which form a seed film and a thin film on a surface of an object to be processed, such as a semiconductor wafer.

2. Description of the Related Art

Generally, in order to manufacture a semiconductor integrated circuit, various processes, such as a film forming process, an etching process, an oxidation process, a diffusion process, a modification process, and a natural oxide film removing process, are performed on a semiconductor wafer including a silicon substrate, etc. The film forming process is described as an example from among the various processes. For example, while manufacturing a semiconductor integrated circuit, such as a dynamic random access memory (DRAM), the film forming process may be performed by providing a recessed portion, such as contact hole, a through hole, a wire groove, or a cylinder groove of a capacitor having a cylindrical structure, on an insulation film formed on a surface of a semiconductor wafer, and embedding the recessed portion with a conductive thin film.

For example, a silicon film containing impurities has been conventionally used as a thin film for embedding the recessed portion, as the silicon film has relatively satisfactory step coverage and furthermore, is relatively inexpensive. The embedding of the recessed portion will now be described with reference to FIGS. 19A and 19B. FIGS. 19A and 19B are views showing an example embedding the recessed portion provided on the surface of the semiconductor wafer.

As shown in FIG. 19A, an insulation film 2 as a base formed of, for example, $SiO_2$, is thinly formed on a surface of a semiconductor wafer W (hereinafter, also referred to as a wafer W) including, for example, a silicon substrate as an object to be processed, and a recessed portion 4 is provided on the insulation film 2. The recessed portion 4 is equivalent to a contact hole promoting contact with a bottom layer or a substrate itself, a through hole, a wire groove, a cylinder groove of a capacitor having a cylindrical structure, or the like. In FIG. 19A, a contact hole promoting contact with a substrate itself is shown as an example. Also, as shown in FIG. 19B, a conductive thin film 6 is formed on the surface of the semiconductor wafer W to embed the recessed portion 4. The silicon film containing impurities as described above is widely used as the thin film 6.

As a film forming method for forming the thin film 6, a film forming method (Patent Reference 1) where a single crystal thin film including impurities is formed at a range of low pressure from about 1 to about $10^{-6}$ Pa by supplying, for example, a gas including a component element of semiconductor silicon, such as $SiCl_4$, and a gas including an impurity element, such as $BCl_3$, alternately into a processing container, a film forming method (Patent Reference 2) where, for example, forming of a polysilicon layer by supplying a monosilane ($SiH_4$) gas and forming of a phosphorous adsorption layer by supplying a phosphine gas are alternately performed, and a method (Patent Reference 3) of forming a film via chemical vapor deposition (CVD) by simultaneously supplying monosilane and boron trichloride ($BCl_3$) are known.

In the above-described film forming methods, step coverage is satisfactory and an embedding characteristic is excellent since the recessed portion described above is satisfactorily embedded when a design rule is relatively loose since a request for minuteness is not so strict. However, when the design rule is strict due to a recent increased request for further minuteness, a sufficient embedding characteristic may not be obtained. Also, for example, the existence of a void 8 generated in the film as shown in FIG. 19B cannot be ignored. The void 8 is a cause for increasing contact resistance.

Specifically, recently, a strict design rule where the recessed portion 4 described above has a hole diameter less than or equal to 40 nm and an aspect ratio is equal to or higher than 10 has been requested, and thus the above problems need to be solved early. Also, aside from the generation of the void 8, a precision of surface roughness may also decrease.

3. Prior Art Reference (Patent Reference 1) Japanese Laid-Open Patent Publication No. sho 61-034928

(Patent Reference 2) Japanese Laid-Open Patent Publication No. hei 05-251357

(Patent Reference 3) Japanese Laid-Open Patent Publication No. hei 08-153688

SUMMARY OF THE INVENTION

To solve the above problems, the present invention provides a thin film forming method and a film forming apparatus which are capable of forming a thin film, such as a silicon film or a silicon germanium film, which has a satisfactory embedding characteristic even at a relatively low temperature and improves a precision of surface roughness.

The inventors of the present application assumed that a surface roughness of an impurity-containing silicon film in an amorphous state is related to an incubation time of the impurity-containing silicon film in the amorphous state. They assumed that as the incubation time increases, the sizes of nuclei are uneven, and thus a precision of the surface roughness of the impurity-containing silicon film in the amorphous state deposited after generation of the nuclei is affected.

As will be described below, the inventors have succeeded in reducing the incubation time of the impurity-containing silicon film in the amorphous state, and as a result, succeeded in further improving the precision of the surface roughness of the impurity-containing silicon film in the amorphous state while improving the embedding characteristic.

According to an embodiment of the present invention, there is provided a thin film forming method which forms a seed film and an impurity-containing silicon film on a surface of an object to be processed in a processing container configured to be vacuum exhaustible, the thin film forming method including: performing a first step which forms the seed film formed of a compound of silicon, carbon and nitrogen on the surface of the object by supplying a seed film raw material gas comprising an aminosilane-based gas into the processing container; and performing a second step which forms the impurity-containing silicon film in an amorphous state on the seed film by supplying a silane-based gas and an impurity-containing gas into the processing container.

Additional objects and advantages of the invention will be set forth in the description which follows, and in part will be obvious from the description, or may be learned by practice of the invention.

The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 3 is a flowchart showing an example of each process of the embodiment of the film forming method of the present invention;

DETAILED DESCRIPTION OF THE INVENTION

Figure 1:
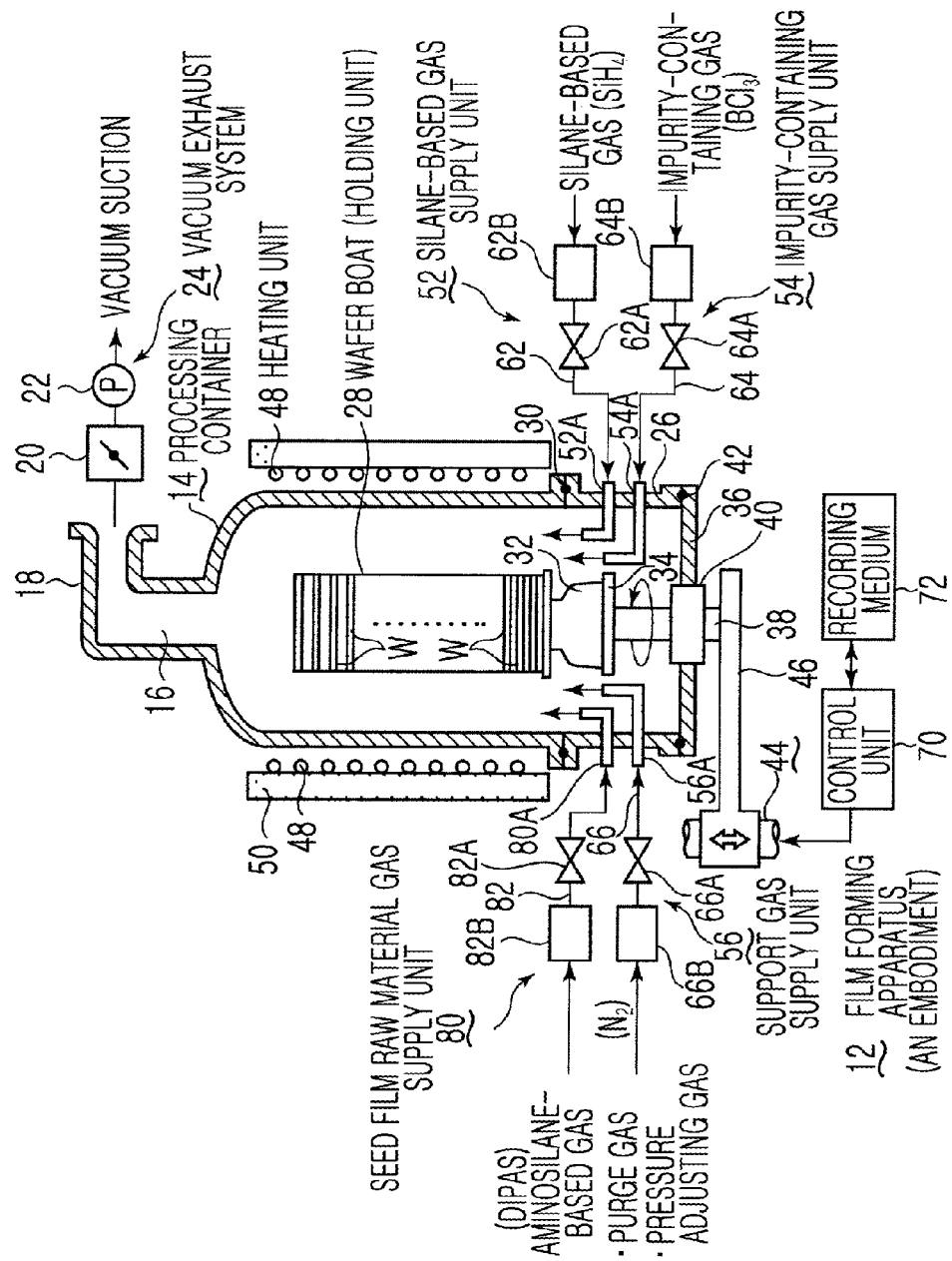
FIG. 1 is a structural view showing an example of an embodiment of a film forming apparatus for performing a film forming method of the present invention.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Hereinafter, a thin film forming method and a film forming apparatus according to embodiments of the present invention are described with reference to attached drawings. Also, in the present specification, "impurity-containing silicon in an amorphous state" is an expression not only indicating impurity-containing silicon in an amorphous state, but also including all of impurity-containing silicon in an amorphous state, nanocrystalline silicon in which amorphous to nanosized crystal grains are gathered and capable of achieving a precision of surface roughness described in the present specification, and silicon in which the impurity-containing silicon in the amorphous state and the nanocrystalline silicon are mixed.

<An Embodiment>

FIG. 1 is a structural view showing an example of an embodiment of a film forming apparatus for performing a film forming method of the present invention. Throughout the drawings, like reference numerals denote like elements. As shown, the film forming apparatus 12 includes a batch-type vertical processing container 14 having a shape of a bottom-open cylinder. The processing container 14 may be formed of, for example, quartz having a high thermal resistance.

An opened exhaust port 16 is provided at a ceiling portion of the processing container 14 while an exhaust nozzle 18, for example, perpendicularly curved in a horizontal direction, is continuously provided from the exhaust port 16. Also, since a vacuum exhaust system 24 including a pressure control valve 20 or a vacuum pump 22 is connected to the exhaust nozzle 18, an atmosphere in the processing container 14 may be vacuum-sucked and exhausted.

A bottom of the processing container 14 is supported by a manifold 26, for example, having a cylindrical shape formed of stainless steel, wherein a wafer boat 28 formed of a quartz is elevatably provided as a holding unit where semiconductor wafers W as a plurality of objects to be processed are stacked in a multi-stage manner at predetermined pitches, such that the semiconductor wafer W is freely inserted into and pulled out from a bottom of the manifold 26. A seal member 30, such as an O-ring, is disposed between a bottom of the processing container 14 and a top of the manifold 26, to maintain air-tightness therebetween.

In the present embodiment, the wafer boat 28 may support, for example, about 50 to 100 wafers W having a diameter of 300 mm in a multi-stage manner at approximately equal pitches. Also, the manifold 26 may be integrally molded with the processing container 14 by using quartz.

The wafer boat 28 is placed on a table 34 via a thermos vessel 32 formed of quartz, and the table 34 is supported at an upper portion of a rotation shaft 38 penetrating through a cover unit 36 opening and closing a bottom opening portion of the manifold 26. Also, for example, a magnetic fluid seal 40 is provided at a penetrating portion of the rotation shaft 38 with respect to the cover unit 36, so as to hermetically seal the rotation shaft 38 while rotatably supporting the rotation shaft 38. Also, a seal member 42, for example, an 0-ring, is provided at a peripheral portion of the cover unit 36 and a bottom portion of the manifold 26, so as to hold sealability in the processing container 14.

The rotation shaft 38 is attached to a leading end of an arm 46 supported by an elevating mechanism 44, for example, a boat elevator, and thus may integrally elevate the wafer boat 28, the cover unit 36, or the like. Alternatively, the table 34 may be fixed towards the cover unit 36, and the wafer W may be processed without having to rotate the wafer boat 28.

A heating unit 48 consisting of a heater formed of a carbon wire is provided to surround a side portion of the processing container 14 such that the semiconductor wafer W disposed therein is heated. Also, an insulator 50 is provided on an outer circumference of the heating unit 48 to secure thermal stability of the heating unit 48. Also, various gas supply units for supplying various gasses into the processing container 14 are provided at the manifold 26.

In detail, a silane-based gas supply unit 52 which supplies a silane-based gas for film formation into the processing container 14, an impurity-containing gas supply unit 54 which supplies an impurity-containing gas into the processing container 14, and a seed film forming raw material gas supply unit 80 which supplies a seed film raw material gas including at least any one of an aminosilane-based gas and a higher silane into the processing container 14, are provided at the manifold 26, respectively. Also, herein, a support gas supply unit 56 which supplies a purge gas or a pressure adjusting gas into the processing container 14 as occasion demands is also provided. Here, an $N_2$ gas is used as a purge gas or a pressure adjusting gas. Alternatively, a rare gas, such as an Ar or He gas, may be used instead of the $N_2$ gas. Also, herein, a case where an aminosilane-based gas is used as the seed film raw material gas will be described as an example.

The silane-based gas supply unit 52, the impurity-containing gas supply unit 54, the support gas supply unit 56, and the seed film raw material gas supply unit 80 respectively include gas nozzles 52A, 54A, 56A and 80A which are provided to penetrate through a side wall of the manifold such that leading end portions thereof are inside the processing container 14. The gas nozzles 52A, 54A, 56A, and 80A are respectively connected to gas passages 62, 64, 66, and 82, wherein opening/closing valves 62A, 64A, 66A, and 82A and flow rate controllers 62B, 64B, 66B, and 82B, such as a mass flow controller, are respectively sequentially provided at the gas passages 62, 64, 66, and 82, and thus a silane-based gas, an impurity-containing gas, an $N_2$ gas, or an aminosilane-based gas may be flowed while a flow rate is being controlled, respectively.

Here, a silane-based gas including, for example, only silicon and hydrogen, herein, monosilane is used as the saline-based gas, a $BCl_3$ gas is used as the impurity-containing gas, an $N_2$ gas is used as the purge gas or pressure adjusting gas, and diisopropyl aminosilane (DIPAS) is used as the aminosilane-based gas. Also, the silane-based gas including only silicon and hydrogen as described above may be used as the silane-based gas, but alternatively, any silane-based gas including at least silicon and hydrogen may be used.

Also, the film forming apparatus may include a control unit 70 including, for example, a microcomputer, so as to control starting or stopping of supply of each gas, a process temperature, a process pressure, or the like, or to control overall processes of the film forming apparatus. The control unit 70 includes a recording medium 72 having recorded thereon a program used to control processes of the film forming apparatus 12. The recording medium 72 includes, for example, a flexible disc, a compact disc (CD), a hard disk, a flash memory, or a digital video disc (DVD). Although not shown, various directions, programs, or the like may be input to the control unit 70 via a user interface by using a dedicated line.

<An Embodiment of Film Forming Method>

Next, an embodiment of a film forming method of the present invention, which is performed by using the film forming apparatus 12 according to the embodiment configured as above, is described. Each process described below is performed under control of the control unit 70 including a computer as described above.

Figure 2:
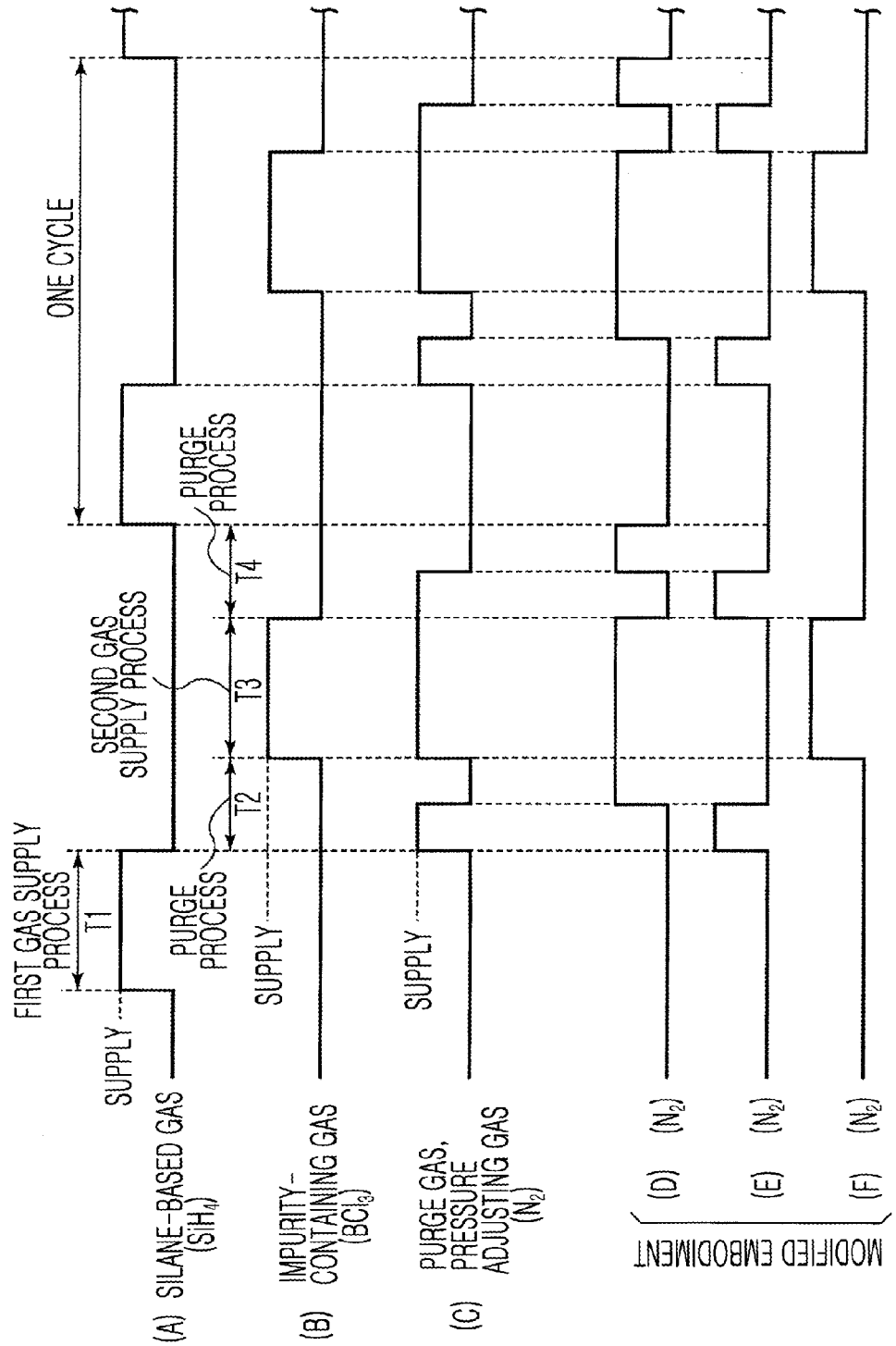
FIG. 2 is a timing chart showing an example of a supply aspect of each gas in a second step of the embodiment of the film forming method of the present invention.
Figure 4A:
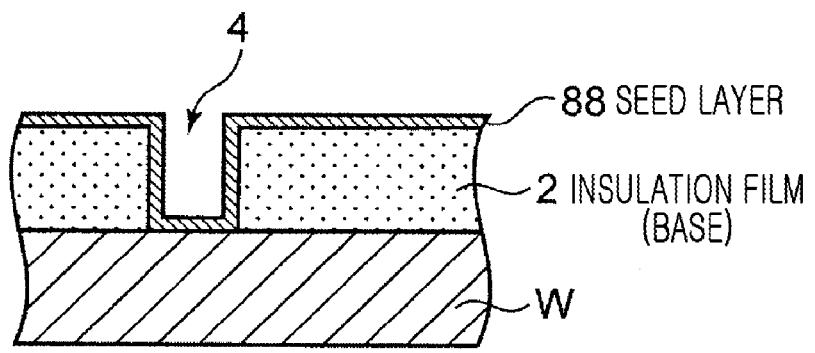
FIGS. 4A and 4B are cross-sectional views showing an example of an object to be processed on which a thin film is formed according to the embodiment of the film forming method of the present invention.
Figure 4B:
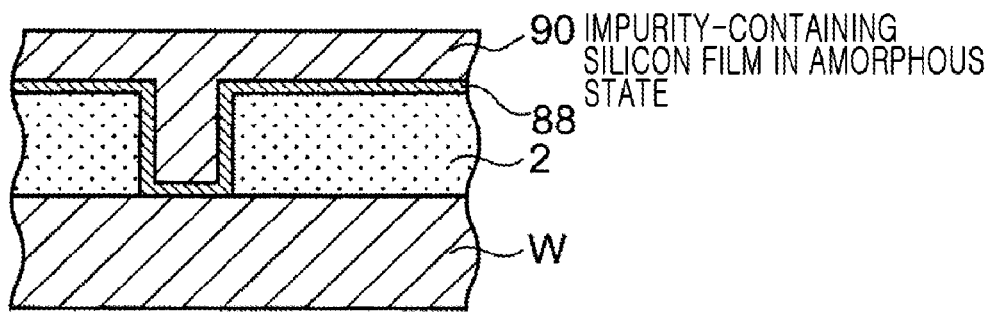
Figure 5A:
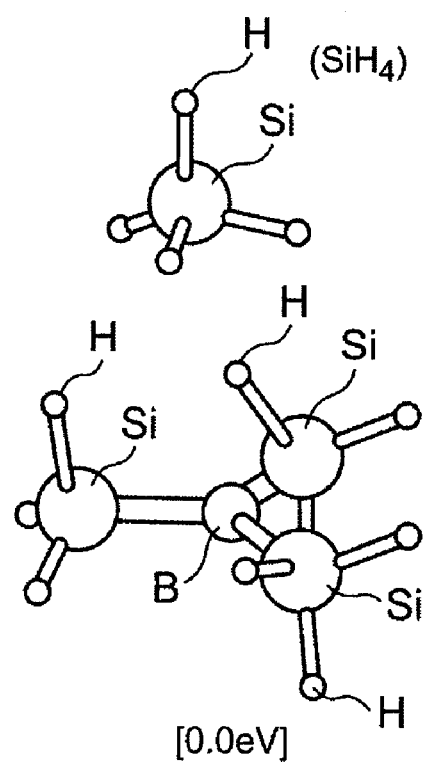
FIGS. 5A through 5C are views schematically showing a reaction process of monosilane ($SiH_4$) and $BCl_3$.
Figure 5B:
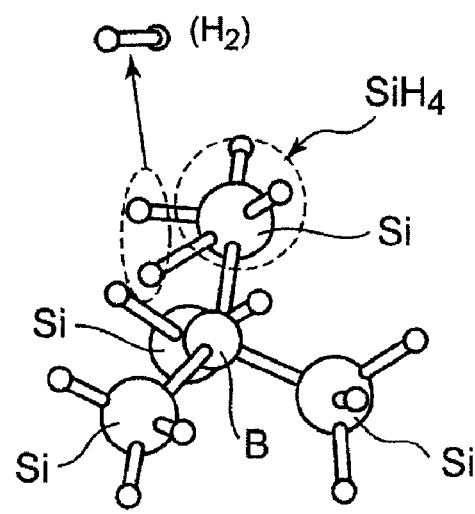
Figure 5C:
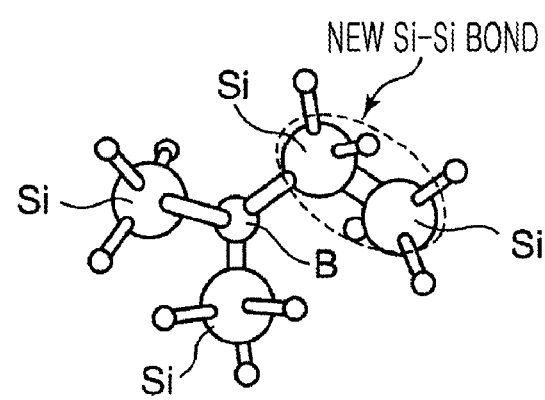

FIG. 2 is a timing chart showing an example of a supply aspect of each gas in a second step of the embodiment of the film forming method of the present invention. FIG. 3 is a flowchart showing an example of each process of the embodiment of the film forming method of the present invention. FIGS. 4A and 4B are cross-sectional views showing an example of an object to be processed on which a thin film is formed according to the embodiment of the film forming method of the present invention. FIGS. 5A through 5C are views schematically showing a reaction process of monosilane ($SiH_4$) and $BCl_3$.

The embodiment of the film forming method of the present invention includes a first step which forms a seed film on a surface of the semiconductor wafer W that is an object to be processed by supplying a seed film raw material gas including at least any one of an aminosilane-based gas and a higher silane into the processing container 14, and a second step which forms an impurity-containing silicon film in an amorphous state by supplying a silane-based gas and an impurity-containing gas into the processing container 14. In the second step, the silane-based gas and the impurity-containing gas may be alternately supplied or simultaneously supplied, and first herein, a case where the silane-based gas and the impurity-containing gas are alternately supplied will be described as an example. In other words, in the second step, a first gas supply process which supplies the silane-based gas into the processing container 14 such that the silane-based gas is adsorbed to the surface of the semiconductor wafer W that is the object to be processed, and a second gas supply process which supplies the impurity-containing gas into the processing container 14 are alternately repeatedly performed.

In the first step 84, for example, DIPAS as an aminosilane-based gas that is a seed film raw material gas is supplied into the processing container 14 so as to perform a seed film forming process which forms a seed film on a surface of the semiconductor wafer W that is an object to be processed (S0). Then, the second step 86 is performed. Also, before performing the second step 86, a purge process which removes a remaining gas inside the processing container 14 may be performed.

In the timing chart of FIG. 2 which shows the supply aspect of each gas in the second step 86, a rising pulse shows a state where a gas is supplied. In detail, in the second step 86, first, a first gas supply process (process S1) is performed by supplying, for example, SiH$_4$ (monosilane) gas, as the silane-based gas into the processing container 14 (refer to (A) of FIG. 2). In the first gas supply process, the monosilane gas is supplied while the monosilane gas is adsorbed on the surface of the semiconductor wafer W that is the object to be processed. Then, a purge process (process S2) which removes the remaining gas inside the processing container 14 is performed (refer to (C) of FIG. 2). Alternatively, the purge process may be omitted.

Then, a second gas supply process (process S3) is performed by supplying, for example, a BCl$_3$ gas, as the impurity-containing gas, into the processing container 14 (refer to (B) of FIG. 2). Accordingly, the BCl$_3$ gas reacts with the SiH$_4$ (monosilane) adsorbed on the surface of the wafer W, and thus a silicon film doped with a very thin boron (B), for example, B having a thickness of 1 atom level, is formed.

Then, the purge process (process S4) which removes the remaining gas inside the processing container 14 may be again performed (refer to (C) of FIG. 2). Alternatively, the purge process may be omitted. Then, it is determined whether one cycle including processes S1 through S4 are repeated in a predetermined cycle number (process S5). Here, one cycle is a period from after the first gas supply process S1 is performed to when a next first gas supply process S1 is performed.

If it is determined that the predetermined cycle number has not been reached in process S5 (NO in process S5), processes S1 through S4 are repeatedly performed until the predetermined cycle number is reached by returning to process S1, and thus a B-doped impurity-containing silicon film in an amorphous state is deposited. Also, when the predetermined cycle number is reached (YES in process S5), the film forming method is ended.

Figure 19A:
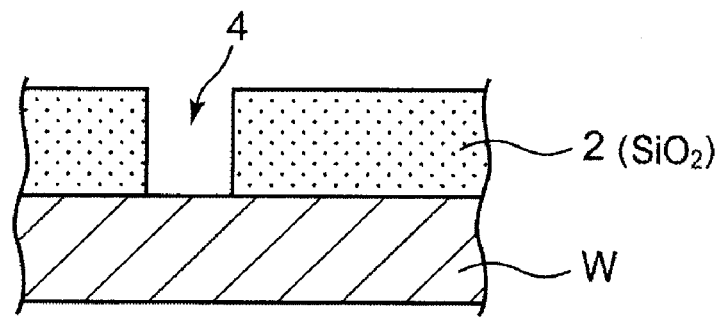
FIGS. 19A and 19B are views showing an example when a recessed portion provided on a surface of a semiconductor wafer is embedded.
Figure 19B:
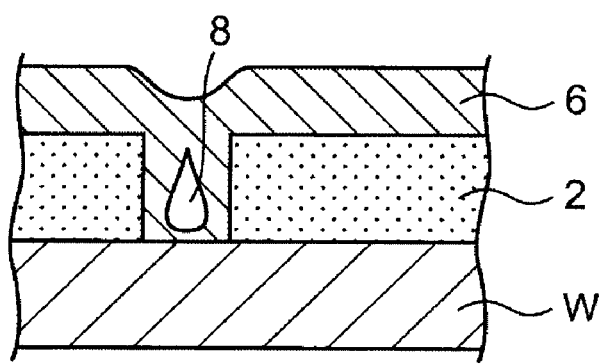

In actual processes, first, the semiconductor wafers W that are not processed are supported by the wafer boat 28 in a multi-stage manner, and in this state, are carried into the processing container 14 that has been heated from the bottom of the processing container 14 and are sealed. A diameter of the semiconductor wafer W is, for example, 300 mm, and 50 to 100 semiconductor wafers W are accommodated. In the previous process, for example, as described above with reference to FIGS. 19A and 19B, the insulation film 2 that is a base is formed on the surface of the semiconductor wafer W, and the recessed portion 4, such as a contact hole or wire groove, is provided on the insulation film 2. The insulation film 2 that is a base is, for example, a silicon oxide film or a silicon nitride film.

The atmosphere inside the processing container 14 is always vacuum-sucked by the vacuum exhaust system 24 during a film forming process such that a pressure is adjusted. Also, the semiconductor wafers W are rotated at a predetermined rotation number during the film forming process as the wafer boat 28 is rotated. Also, as described above, the film forming process is performed as various gases are supplied into the processing container 14.

In the first step 84, the aminosilane-based gas is flowed into the processing container 14 while the semiconductor wafer W is heated, thereby forming a seed film 88 on an entire surface including a surface of the insulation film 2 that is a base and a side or bottom surface of the recessed portion 4, as shown in FIG. 4A (process S0). The seed film 88 is mostly formed of a compound of silicon, carbon, and nitrogen.

The aminosilane-based gas may include at least one gas selected from the group consisting of butyl aminosilane (BAS), bis(tertiary butyl aminosilane) (BTBAS), dimethyl aminosilane (DMAS), bis(dimethyl aminosilane) (BDMAS), tridimethyl aminosilane (TDMAS), diethyl aminosilane (DEAS), bis(diethyl aminosilane) (BDEAS), dipropyl aminosilane (DPAS), diisopropyl aminosilane (DIPAS), and hexaethyl aminodisilane (HEAD).

Not only an aminosilane-based gas having one silicon (Si) atom in a molecular formula, but alternatively, for example, hexakisethylaminodisilane ($C_{12}H_{36}N_6Si_2$) having two silicon atoms in a molecular formula may be used.

Aside from hexakisethylaminodisilane, one of materials represented by Formulas 1 through 4 may be used.

$$((R1R2)N)_n Si_2 H_{6-n-m}(R3)_m \tag{1}$$

$$((R1)NH)_n Si_2 H_{6-n-m}(R3)_m \tag{2}$$

Here, "n" denotes the number of amino groups and "m" denotes the number of alkyl groups.

In Formulas 1 and 2, R1, R2, R3=CH$_3$, C$_2$H$_5$, C$_3$H$_7$.

Also, R1, R2, and R3 may be the same or different from each other.

"n" is an integer from 1 to 6.

"m" is 0 or an integer from 1 to 5.

$$((R1R2)N)_n Si_2 H_{6-n-m}(Cl)_m \tag{3}$$

$$((R1)NH)_n Si_2 H_{6-n-m}(Cl)_m \tag{4}$$

Here, "n" is the number of amino groups and "m" denotes the number of chlorine.

In Formulas 3 and 4, R1, R2=CH$_3$, C$_2$H$_5$, C$_3$H$_7$.

Also, R1 and R2 may be the same or different from each other.

"n" is an integer from 1 to 6.

"m" is 0 or an integer from 1 to 5.

In the present example, DIPAS is used as described above.

An example of process conditions in the first step 84 is as follows:

DI PAS Flow Rate: 500 sccm

Process Time: 5 min

Process Temperature: 400° C.

Process Pressure: 53.2 Pa (0.4 Torr).

The process temperature may be in a range from 25° C. (room temperature) to 550° C. When the process temperature is lower than 25° C., throughput is deteriorated due to a high temperature difference between the process temperature and a silicon film forming temperature, and when the process temperature is higher than 550° C., the process temperature is not suitable since an adsorption mode changes to a chemical vapor deposition (CVD) mode as an adsorption amount of DIPAS increases to one molecular layer or more.

Hereinafter, the first step 84 is also referred to as pre-flow in the present specification. When the first step 84 (seed film forming process S0) is ended, the second step 86 is performed. In the first gas supply process S1 of the second step 86, the monosilane gas is supplied from the gas nozzle 52A of the silane-based gas supply unit 52 while a flow rate is controlled. The monosilane gas is adsorbed on the surface of the wafer W elevating and rotating inside the processing container 14, and the remaining gas is exhausted by the vacuum exhaust system 24 through the exhaust port 16 and the exhaust nozzle 18 at the top.

Regarding the process conditions at this time, the flow rate of the monosilane gas is, for example, in a range from 100 to 4000 sccm, for example, about 1200 sccm, the process pressure is in a range from 27 to 6665 Pa (0.2 to 50 Torr), for example, about 533 Pa (4 Torr), a process temperature is in a range from 350 to 600° C., for example, about 400° C., and a supply period of time T1 of gas is in a range from 1 to 300 seconds, for example, about 60 seconds.

Here, when the process temperature is lower than 350° C., it is difficult for monosilane to adsorb on the surface of the wafer W, and when the process temperature is higher than 600° C., monosilane may be thermally decomposed and a silicon film may be deposited. Also, when the process pressure is lower than 27 Pa, the process pressure is too low for monosilane to be adsorbed. When the process pressure is higher than 6665 Pa, it is difficult to control a concentration of B in a film as a plurality of layers of monosilane are adsorbed.

During the purge process (process S2) immediately after the first gas supply process, the $N_2$ gas is supplied from the gas nozzle 56A of the support gas supply unit 56 while a flow rate is controlled. Here, the $N_2$ gas is used as a purge gas, and is used to remove the monosilane gas remaining inside the processing container 14. Here, instead of supplying the $N_2$ gas throughout the entire time of the purge process, the $N_2$ gas may be supplied for only a part, for example, a first half of the purge process, and only vacuum suction may be continuously performed for a latter half of the purge process without supplying the $N_2$ gas.

Here, regarding the process conditions, the flow rate of the $N_2$ gas is about, for example, 5 slm maximum. The process pressure is in a range from 27 to 6665 Pa, the process temperature is in a range from 350 to 600° C., and a purge period of time T2 is in a range from 0 to 300 seconds, for example, about 30 seconds.

In the second gas supply process (process S3) after the purge process, the $BCl_3$ gas is supplied from the gas nozzle 54A of the impurity-containing gas supply unit 54 while a flow rate is controlled. At the same time, $N_2$ gas as the pressure adjusting gas is supplied from the gas nozzle 56A of the support gas supply unit 56 while a flow rate is controlled ((C) of FIG. 2). The $BCl_3$ gas and the $N_2$ gas elevate inside the processing container 14, and the $BCl_3$ gas reacts with monosilane adsorbed on the surface of the wafer W to form an amorphous boron-containing silicon film. Also, the remaining gas is exhausted by the vacuum exhaust system 24 through the exhaust port 16 and the exhaust nozzle 18 at the top.

Here, regarding the process conditions, the flow rate of the $BCl_3$ gas is, for example, in a range from 1 to 500 sccm, for example, about 100 sccm, the flow rate of the $N_2$ gas is about 5 slm maximum, the process pressure is in a range from 27 to 6665 Pa (0.2 to 50 Torr), for example, about 533 Pa (4 Torr), the process temperature is in a range from 350 to 600° C., for example, about 400° C., and a supply period of time T3 of gas is in a range from 1 to 300 seconds, for example, about 60 seconds.

Here, when the process temperature is lower than 350° C., it is difficult for monosilane adsorbed on the surface of the wafer W and $BCl_3$ to react, and when the process temperature is higher than 600° C., it takes time for a temperature to increase. Also, in order to reduce a film forming time, the process temperature may be the same in the first and second steps.

In the purge process (process S4) immediately after the second gas supply process, the $N_2$ gas is supplied from the gas nozzle 56A of the support gas supply unit 56, like the purge process of process S2, while a flow rate is controlled. In reality, the $N_2$ gas is continuously supplied from the second gas supply process. Here, the $N_2$ gas is used as the purge gas and is used to remove the $BCl_3$ gas remaining inside the processing container 14. Here, instead of supplying the $N_2$ gas throughout the entire time of the purge process, the $N_2$ gas may be supplied for only a part, for example, a first half of the purge process, and only vacuum suction may be continuously performed for a latter half of the purge process without supplying the $N_2$ gas.

Here, the process conditions are identical to the purge process in process S2. In other words, the flow rate of the $N_2$ gas is, for example, 5 slm maximum. The process pressure is in a range from 27 to 6665 Pa, the process temperature is in a range from 350 to 600° C., and a purge period of time T4 is in a range from 0 to 300 seconds, for example, about 30 seconds.

One cycle including processes S1 through S4 described above is repeatedly performed by a predetermined cycle number. Although the cycle number depends on a target film thickness to be formed, and since, for example, about 0.2 to 0.7 nm film thickness is formed via one cycle, about 100 cycles are performed if, for example, about 60 nm film thickness is required. As such, a thin film formed of an impurity-containing silicon film 90 in an amorphous state having a very thin atom level thickness and doped with B as an impurity is deposited on the seed film 88 (refer to FIG. 4B), and the recessed portion 4 (refer to FIG. 4A or 4B) provided on the surface of the semiconductor wafer W may be satisfactorily embedded.

Here, a process of forming a B-doped impurity-containing silicon film in an amorphous state will now be described with reference to a schematic view shown in FIGS. 5A through 5C. FIGS. 5A through 5C are schematic views showing a result when a process of forming a B-doped impurity-containing silicon film in an amorphous state is simulated by using a quantum chemical calculation. Activation energy (eV) is shown at a bottom of each drawing. Herein, specifically, a possibility of low temperature film formation by alternately supplying $SiH_4$ (monosilane) and $BCl_3$ is verified via a simulation.

First, when $SiH_4$ (monosilane) introduced from outside a film forming apparatus approaches an Si—B bond already formed on a surface of a semiconductor wafer (refer to FIG. 5A), $SiH_2$ is generated as $H_2$ is removed from $SiH_4$ (monosilane) according to catalysis generated due to a boron atom as shown in FIG. 5B, and $SiH_2$ is easily introduced to a B-adsorption site. In detail, activation energy of $SiH_2$ to the B-adsorption site is decreased to about 1.2 eV. Also, when there is no boron, activation energy is about +2.4 eV. Then, as shown in FIG. 5C, a Si—Si bond is serially formed.

In this regard, a film can be formed even at a low temperature of about 350° C., which was practically impossible by supplying only $SiH_4$ (monosilane) like a conventional technology, and a thin film having satisfactory step coverage is obtained by alternately supplying gases.

Meanwhile, it was almost impossible to practically form a film via a conventional CVD method using only $SiH_4$ (monosilane). Also, in a CVD method using only $Si_2H_6$, a film can be formed at a process temperature of 400° C., but a satisfactory result was not obtained since a step coverage of the film was only about 80%.

As such, since the thin film forming method which forms a seed film and an impurity-containing silicon film on a surface of an object to be processed in a processing container configured to be vacuum exhaustible includes performing a first step which forms the seed film on the surface of the object to be processed by supplying a seed film raw material gas including at least any one of an aminosilane-based gas and a higher silane into the processing container, and performing a second step which forms the impurity-containing silicon film in an amorphous state by supplying a silane-based gas and an impurity-containing gas into the processing container, it is possible to form the impurity-containing silicon film in the amorphous state having a satisfactory embedding characteristic even at a relatively low temperature and improving a precision of surface roughness.

<Evaluation on Film Forming Method of Present Invention>

A result of evaluating a B-doped amorphous silicon film formed on a seed film by actually performing a film forming method of the present invention will now be described. Here, a silicon oxide film was formed as a base layer on a surface of a silicon substrate as a semiconductor wafer, and a recessed portion having a hole diameter of 50 nm and an aspect ratio of 7 was provided on the silicon oxide film. Then, the seed film 88 was formed on the silicon oxide film, and additionally, the impurity-containing silicon film 90 in the amorphous state doped with B as an impurity was formed on the seed film 88.

As a film forming method, the first and second steps 84 and 86 shown in FIG. 3 were performed, and processes described above with reference to (A) through (C) of FIG. 2 were performed in the second step 86. DIPAS that is a type of an aminosilane-based gas was used as the seed film raw material gas, $SiH_4$ (monosilane) was used as the silane-based gas, and $BCl_3$ was used as an impurity-containing gas. Regarding process conditions, a flow rate of a DIPAS gas was 500 sccm, a flow rate of a $SiH_4$ (monosilane) gas was 2000 sccm, a flow rate of a $BCl_3$ gas was 200 sccm, and a flow rate of an $N_2$ gas was 2 slm when used as a purge gas and was 1 slm when used as a pressure adjusting gas. A process temperature was set to 400° C. throughout processes, and process pressures in the first and second gas supply processes were both 533 Pa (4 Torr). A time taken for the seed film forming process (process S0) in the first step was 5 min, and the times T1 through T4 in the second step 86 were each 30 seconds.

Figure 6:
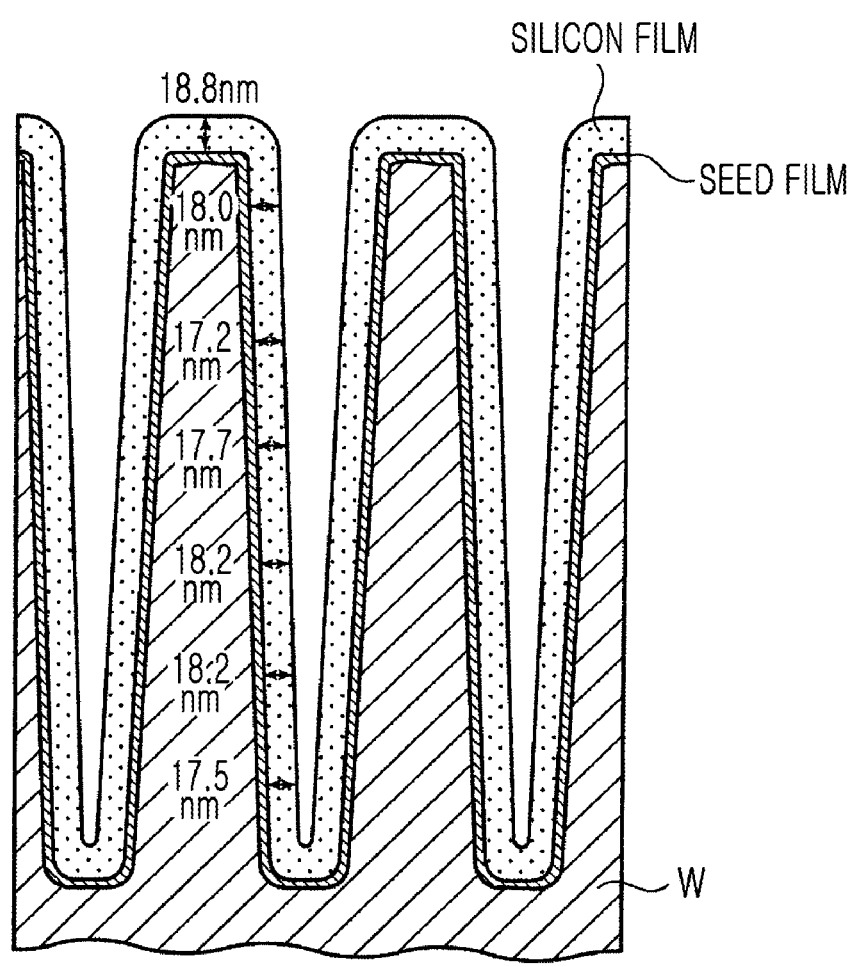
FIG. 6 is a schematic view of an electron microscopic image when a boron-doped impurity-containing silicon film in an amorphous state is formed on a recessed portion.

As such, a B-doped impurity-containing silicon film in an amorphous state having a thickness of 180 Å was obtained in 60 cycles as a result of forming a film on a wafer including a surface having a trench structure, as shown in FIG. 6. FIG. 6 is a schematic view of an electron microscopic image when a B-doped impurity-containing silicon film in an amorphous state is formed on a recessed portion. Here, a diameter of the recessed portion is 50 nm, and an aspect ratio (A/R) of the recessed portion is 7. In FIG. 6, a film thickness is shown along the inside of the recessed portion. Based on FIG. 6, an excellent result is obtained as a step coverage is 95% or above.

Also, in the embodiment of the film forming method, the $N_2$ gas is supplied as a purge gas during the purge period of times T2 and T4 of the purge processes and as a pressure adjusting gas during the supply period of time T3 of the second gas supply process, as shown in (C) of FIG. 2, but alternatively, the $N_2$ gas may be supplied as follows. (D) through (F) of FIG. 2 show modified embodiments of supply of the $N_2$ gas. In (D) of FIG. 2, unlike (C) of FIG. 2, the $N_2$ gas is not supplied during a first half of the two purge processes before and after the second gas supply process, but is supplied during a latter half of the purge processes. Also, like (C) of FIG. 2, the $N_2$ gas is supplied as the pressure adjusting gas in the second gas supply process.

In (E) of FIG. 2, the $N_2$ gas is supplied during the two purge processes before and after the second gas supply process like (C) of FIG. 2, but the $N_2$ gas (pressure adjusting gas) is not supplied during the second gas supply process. Also, in (D) of FIG. 2, the $N_2$ gas may not be supplied during the second gas supply process.

In (F) of FIG. 2, unlike above, the $N_2$ gas (purge gas) is not supplied throughout the two purge processes before and after the second gas supply process, and the $N_2$ gas (pressure adjusting gas) is supplied like (C) of FIG. 2 during the second gas supply process. As such, the supply of purge gas or pressure adjusting gas may have various aspects. The pressure adjusting gas is supplied during the second gas supply process as described above since silicon may easily migrate when pressure largely changes between the first and second gas supply processes. Also, an annealing process may be performed by heating the semiconductor wafer W after ending the first and second steps 84 and 86.

MODIFIED EXAMPLE

In the above embodiments, the silane-based gas and the impurity-containing gas are alternately supplied in the second step, but alternatively, the silane-based gas and the impurity-containing gas may be simultaneously supplied to form an impurity-containing silicon film via a CVD method. In this case, regarding process conditions, a flow rate of the silane-based gas (for example, monosilane), is in a range from 100 to 2000 sccm and a flow rate of the impurity-containing gas (for example, $BCl_3$) is in a range from 50 to 2000 sccm. Also, a process pressure is in a range from 0.1 to 10 Torr and a process temperature is in a range from 350 to 600° C. Also, a process time is determined based on a film thickness required. The same effects as the above embodiments may be obtained in the modified example.

<Evaluation on Type of Base (Insulation Film 2) and Existence of Seed Film>

Next, the results of evaluating a type of a base (insulation film 2) and the existence of a seed film will now be described. Here, according to the film forming method described above, the seed film 88 was formed by pre-flowing the aminosilane-based gas as a seed film raw material gas on the surface of the insulation film 2 that is a base, and then the impurity-doped impurity-containing silicon film 90 in the amorphous state was formed on the seed film 88.

Figure 7:
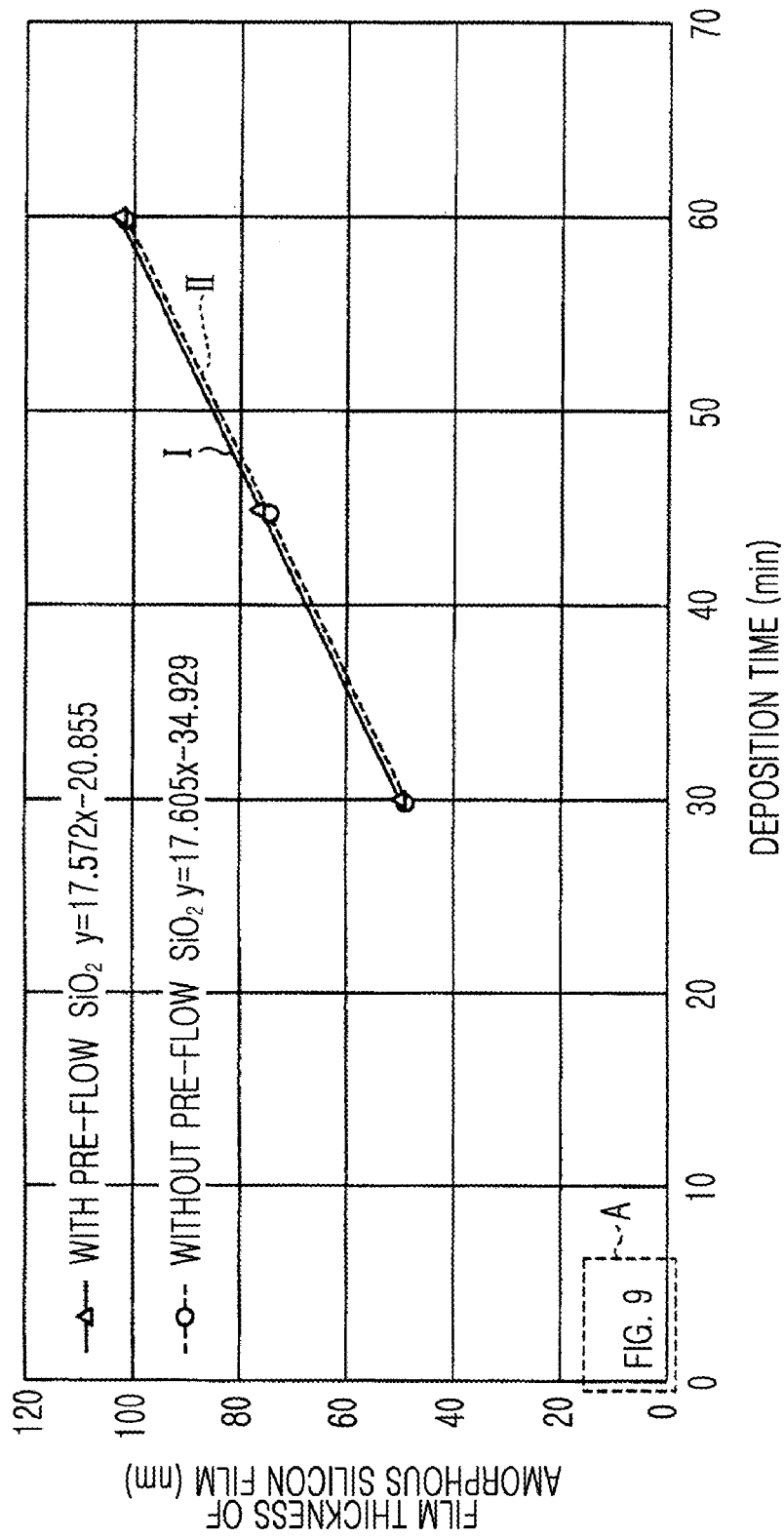
FIG. 7 is a diagram showing a relationship between a deposition time and a film thickness of an impurity-containing silicon film in an amorphous state.
Figure 8:
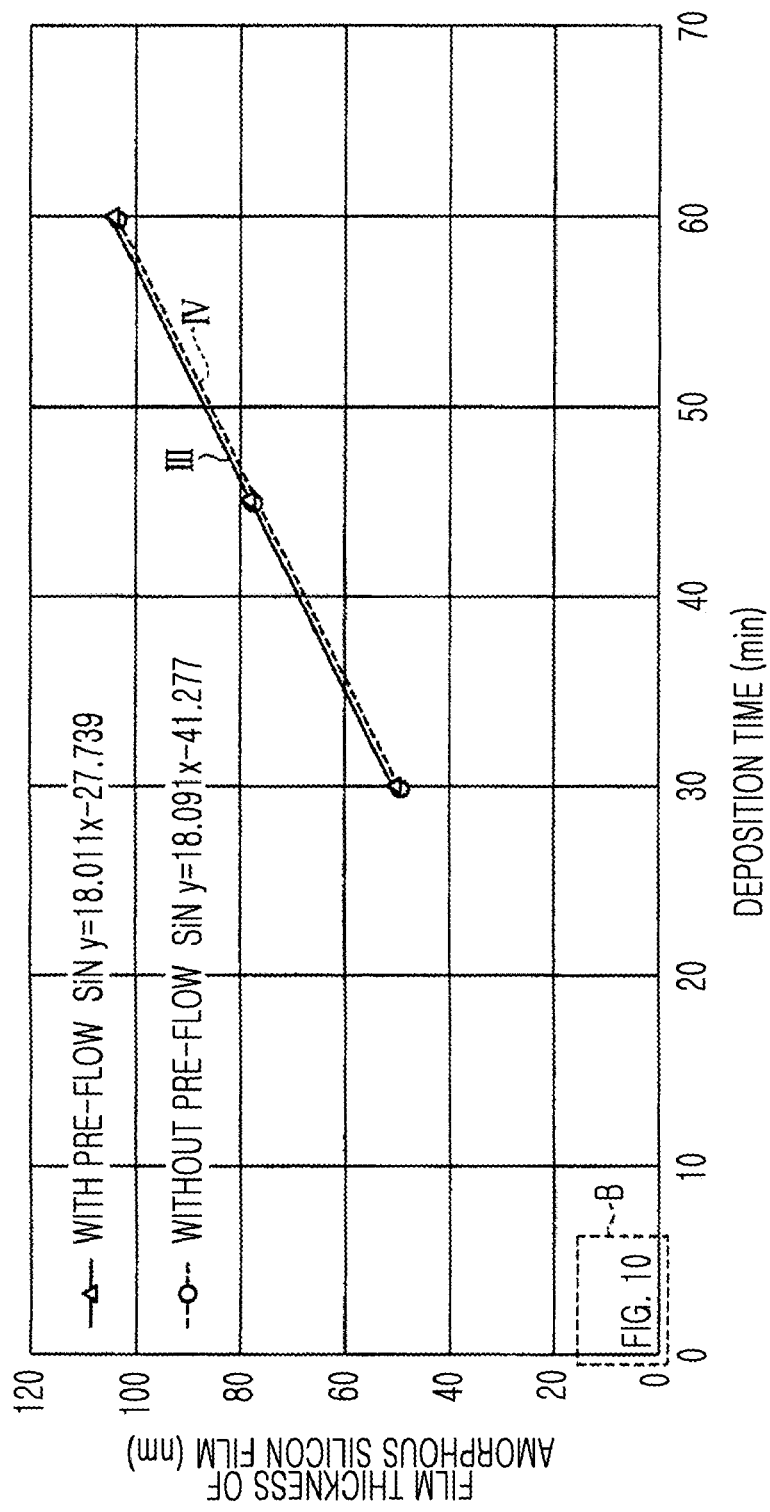
FIG. 8 is a diagram showing a relationship between a deposition time and a film thickness of an impurity-containing silicon film in an amorphous state.

FIGS. 7 and 8 are diagrams showing a relationship between a deposition time and a film thickness of the impurity-containing silicon film 90 in the amorphous state. In FIG. 7, a silicon oxide ($SiO_2$) film is used as the insulation film 2 that is a base, and in FIG. 8, a silicon nitride (SiN) film is used as the insulation film 2 that is a base. The film thickness of the impurity-containing silicon film 90 in the amorphous state was measured at three points, when the deposition time is 30 minutes, 45 minutes, and 60 minutes.

In FIGS. 7 and 8, lines I and III show cases when there are pre-flows, and lines II and IV show cases when there are no pre-flows (no seed film 88). The lines I through IV are approximately straight lines obtained by performing a least-squares method on the three measured film thicknesses as follows:

$$\text{Line I: } y=17.572x-20.855 \tag{1}$$

$$\text{Line II: } y=17.605x-34.929 \tag{2}$$

$$\text{Line III: } y=18.011x-27.739 \tag{3}$$

$$\text{Line IV: } y=18.091x-41.277 \tag{4}$$

As shown in FIGS. 7 and 8, when there is a pre-flow, a film thickness of the impurity-containing silicon film 90 in the amorphous state tends to increase compared to when there is no pre-flow.

Figure 9:
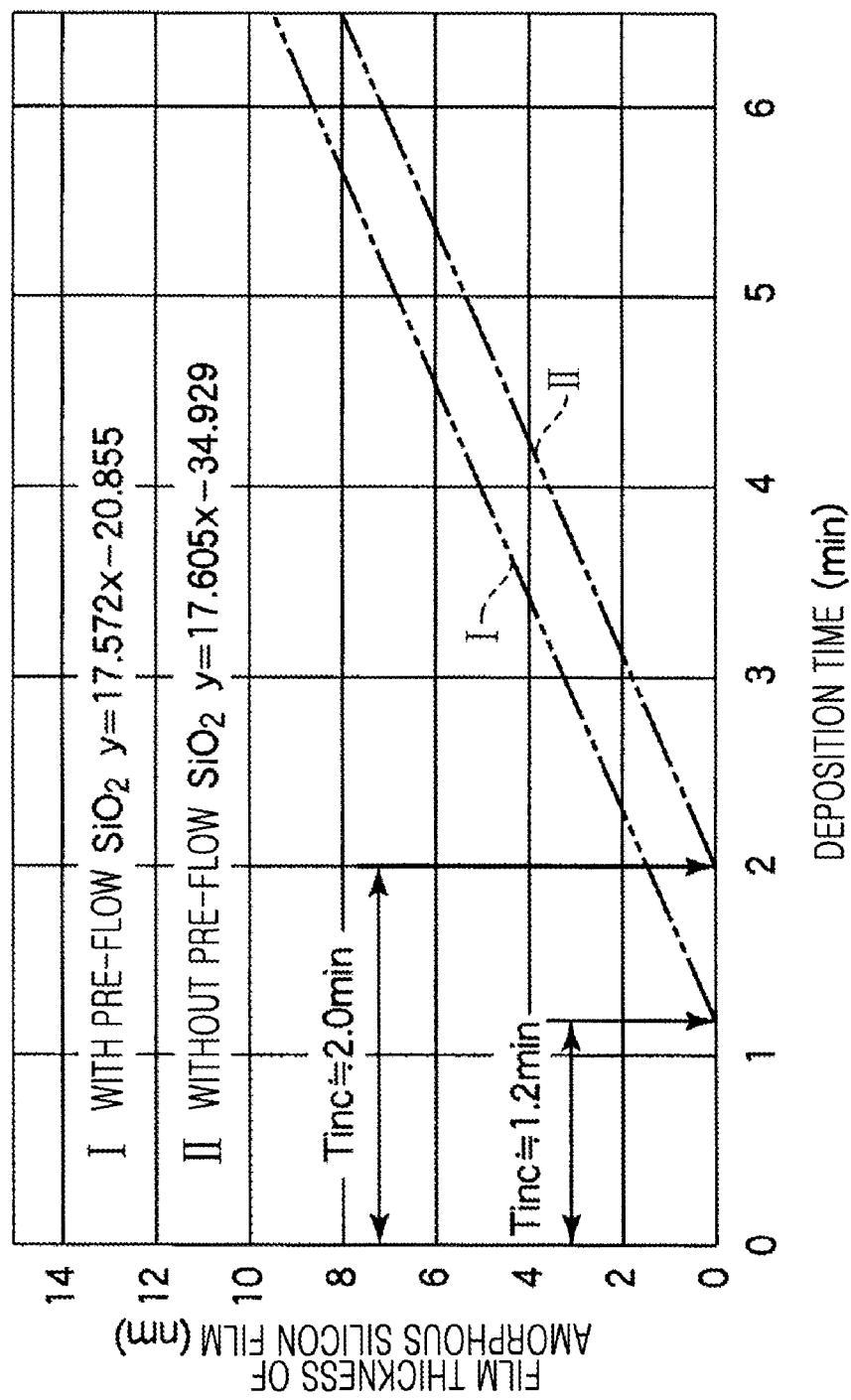
FIG. 9 is an enlarged view of dashed block A in FIG. 7.
Figure 10:
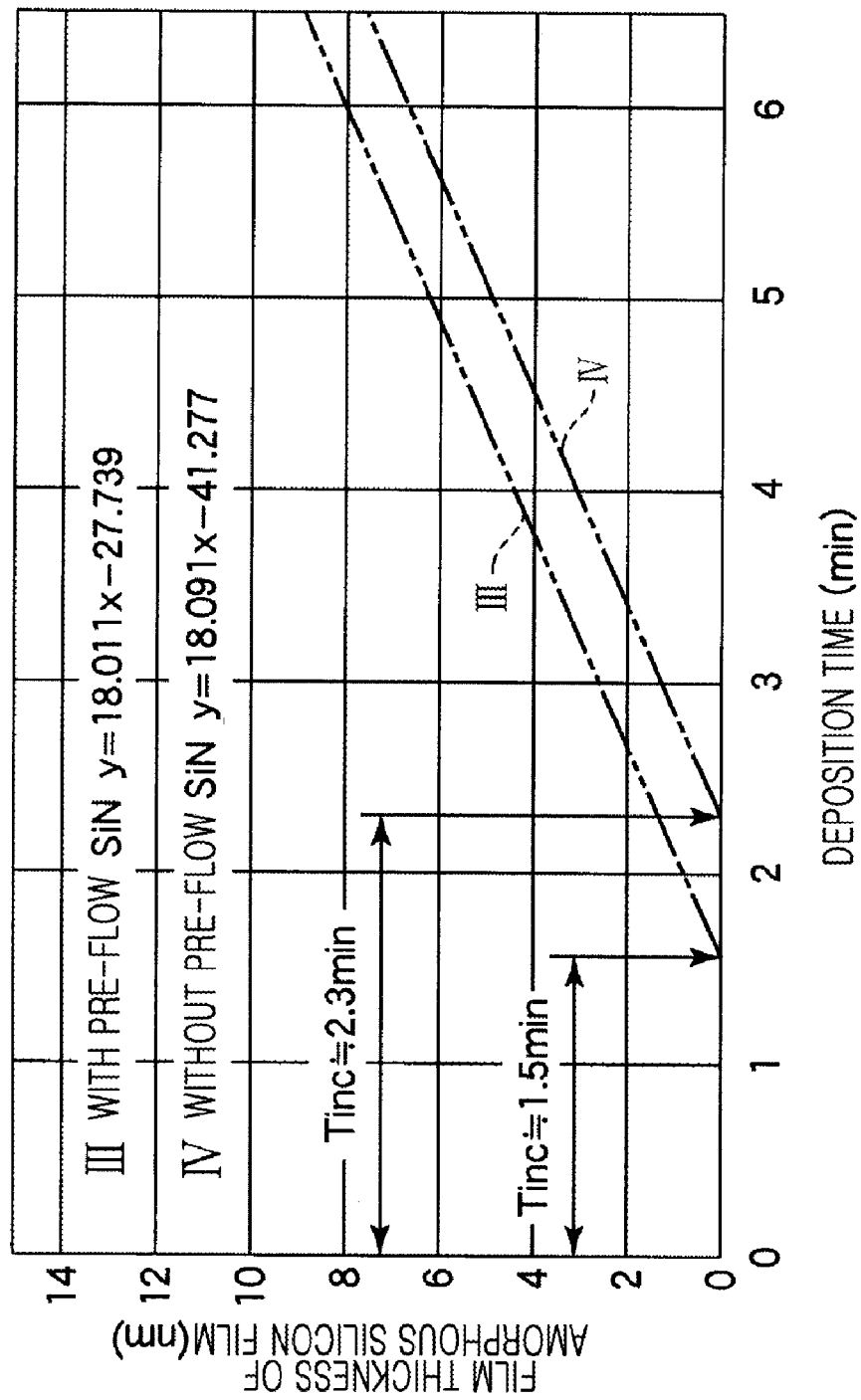
FIG. 10 is an enlarged view of dashed block B in FIG. 8.

In Equations 1 through 4, when y=0, i.e., when a film thickness of an impurity-containing silicon film in an amorphous state is 0, intersections between the lines I through IV and the deposition time are shown in FIGS. 9 and 10. Also, FIG. 9 is an enlarged view of dashed block A in FIG. 7, and FIG. 10 is an enlarged view of dashed block B in FIG. 8.

As shown in FIG. 9, when the insulation film 2 that is a base is a silicon oxide film with a pre-flow, deposition of the impurity-containing silicon film 90 in the amorphous state starts from about 1.2 minutes (x≒1.189) after a process starts. In this regard, when the insulation film 2 is a silicon oxide film without a pre-flow, deposition of the impurity-containing silicon film 90 in the amorphous state starts from about 2.0 minutes (x≒1.984) after a process starts.

Also, as shown in FIG. 10, when the insulation film 2 that is a base is a silicon nitride film with a pre-flow, deposition of the impurity-containing silicon film 90 in the amorphous state starts from about 1.5 minutes (x≒1.540) after a process starts, whereas when the insulation film 2 is a silicon nitride film without a pre-flow, deposition of the impurity-containing silicon film 90 in the amorphous state starts from about 2.3 minutes (x≒2.282) after a process starts. As such, by pre-flowing the aminosilane-based gas on the insulation film 2 that is a base to form the seed film 88, an incubation time may be reduced from about 2.0 minutes to about 1.2 minutes when the insulation film 2 as a base is a silicon oxide film and from about 2.3 minutes to about 1.5 minutes when the insulation film 2 as a base is a silicon nitride film.

Also, when a surface of an impurity-containing silicon film in an amorphous state is observed (a base is a silicon oxide film) by using a scanning electron microscope (SEM), the surface of the impurity-containing silicon film in the amorphous state is smoothened when an aminosilane-based gas is pre-flowed compared to when there is no pre-flow, and thus surface roughness is improved.

Figure 11:
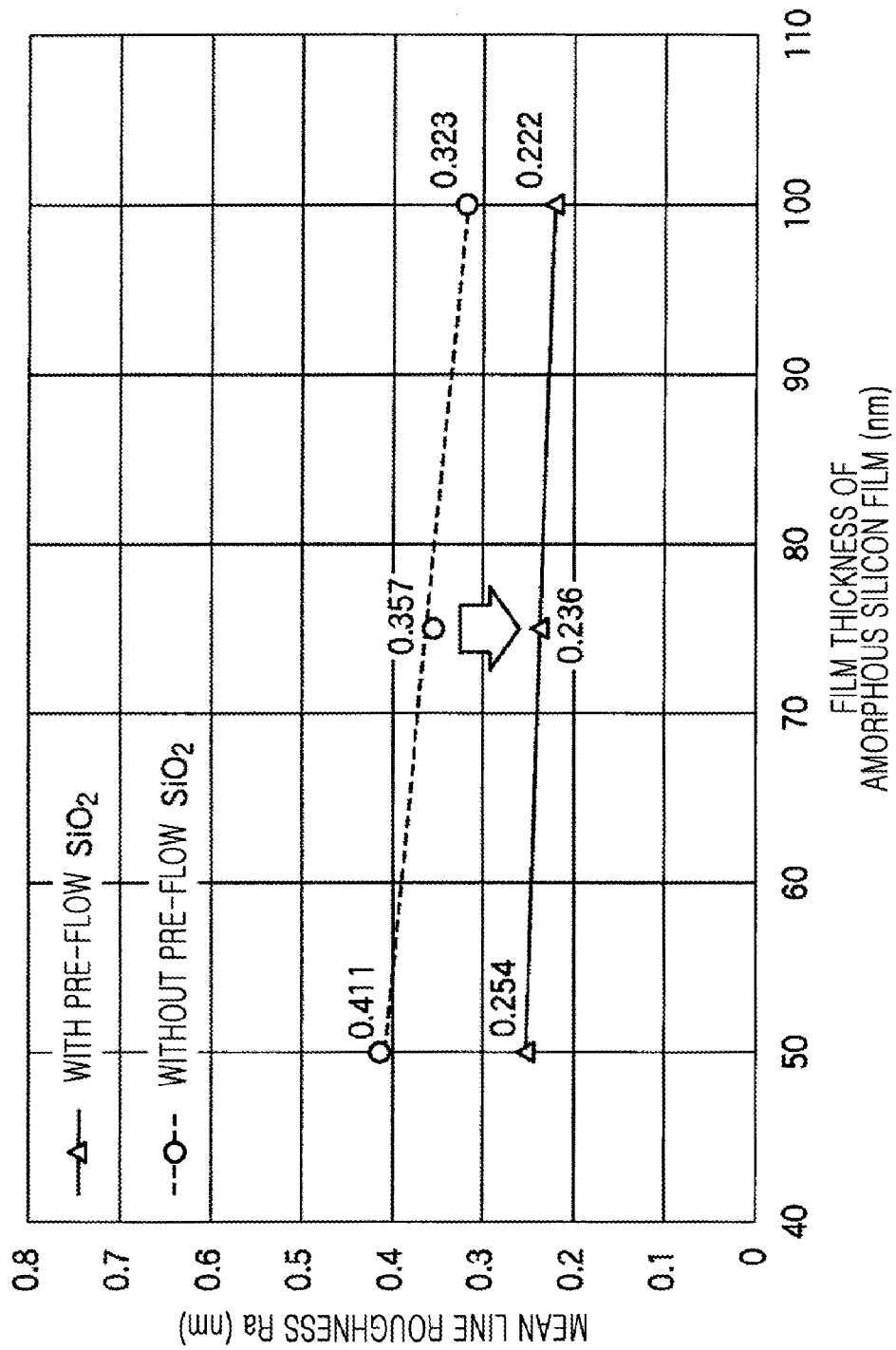
FIG. 11 is a diagram showing a relationship between a film thickness of an impurity-containing silicon film in an amorphous state and a mean line roughness Ra of a surface of the impurity-containing silicon film in the amorphous state.

FIG. 11 is a diagram showing a mean line roughness (surface roughness) Ra of a surface of an impurity-containing silicon film in an amorphous state measured by using an atomic force microscope (AFM). In FIG. 11, a scan size of the AMF was 1 μm and a scan rate was 1.993 Hz.

As shown in FIG. 11, when there is a pre-flow of an aminosilane-based gas, the mean line roughness (surface roughness) Ra is improved to a range from 0.101 to 0.157 nm compared to when there is no pre-flow. Based on the measurement results by the AFM, it has been determined that the mean line roughness (surface roughness) Ra highly improved according to a film forming method of an impurity-containing silicon film in an amorphous state in the present invention, specifically when a film thickness of the impurity-containing silicon film in the amorphous state is thin, compared to when there is no pre-flow.

For example, in an impurity-containing silicon film in an amorphous state having a film thickness of about 50 nm, Ra is 0.441 nm when there is no pre-flow and Ra is 0.254 nm when there is a pre-flow, and thus Ra improved by 0.157 nm. Such results show that the film forming method of the impurity-containing silicon film in the amorphous state in the present invention is effective as a semiconductor apparatus is further miniaturized.

Figure 12:
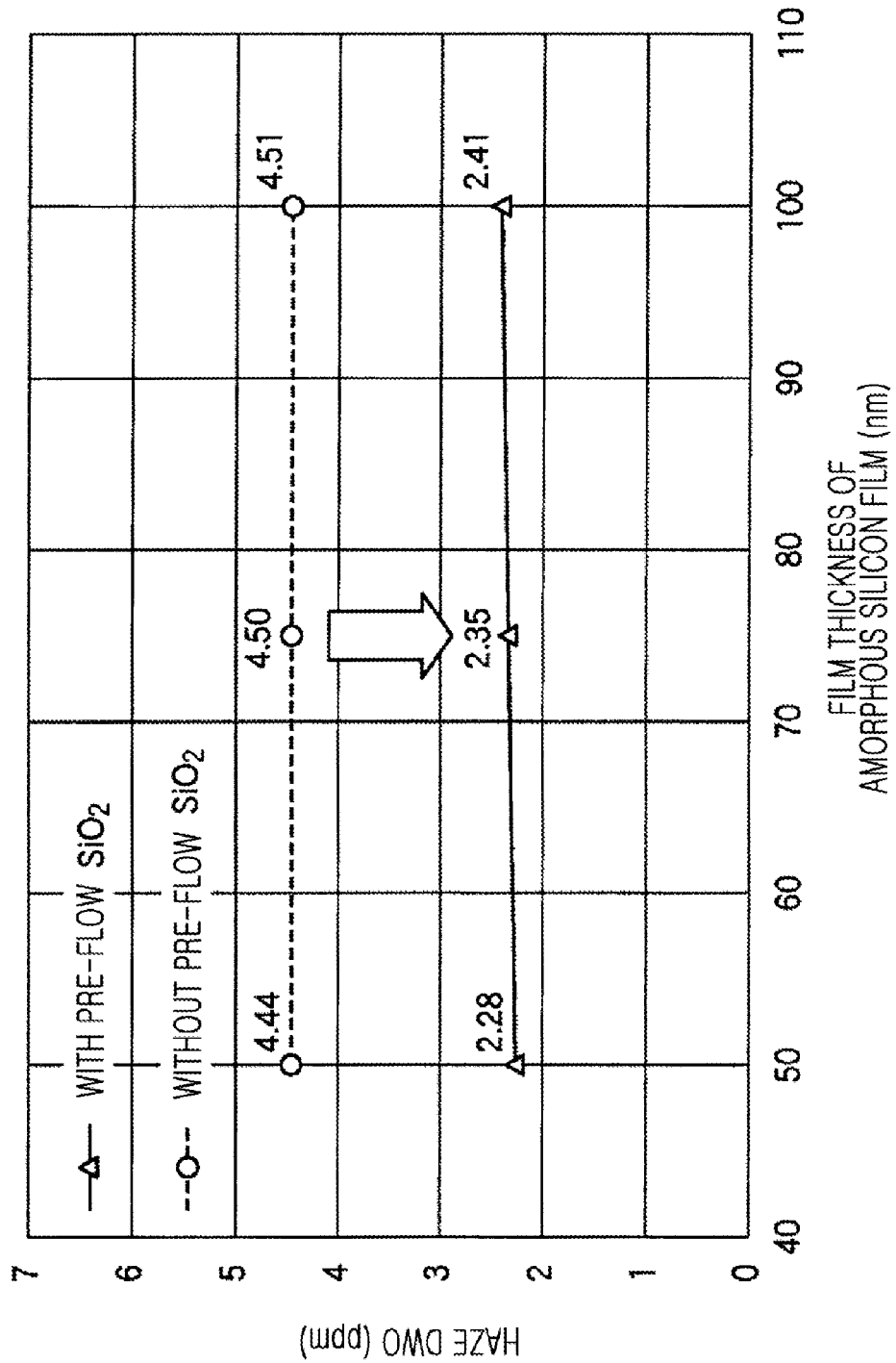
FIG. 12 is a diagram showing a relationship between a film thickness of an impurity-containing silicon film in an amorphous state and a haze of a surface of the impurity-containing silicon film in the amorphous state.

FIG. 12 is a diagram showing a relationship between a film thickness and a haze of a surface of an impurity-containing silicon film in an amorphous state measured by using a surface examining apparatus. The haze shown in FIG. 12 is a haze in a dark field wide oblique (DWO) mode. As shown in FIG. 12, when there is a pre-flow of an aminosilane-based gas, a haze is improved by about 2.1 ppm in a range of a film thickness 50 m to a film thickness 100 nm compared to when there is no pre-flow.

As described above, based on observation and measurement results using the SEM, the AFM, and the surface examining apparatus, according to the film forming method of an impurity-containing silicon film in the amorphous state in the present invention, the impurity-containing silicon film 90 in the amorphous state having a high precision of surface roughness, i.e., having small surface roughness can be formed by pre-flowing the aminosilane-based gas as a seed film raw material gas on the surface of the base of the semiconductor wafer to form the seed film 88, and then supplying and thermally decomposing the aminosilane-based gas on the seed film 88.

Such an impurity-containing silicon film 90 in an amorphous state is useful in embedding, for example, a contact hole provided on an interlayer insulation film including a silicon oxide film or silicon nitride film, or a line provided on the interlayer insulation film, for example, a groove for an inner wire.

<Another Embodiment>

Next, another embodiment of the present invention will now be described. In the previous embodiment, the impurity-containing silicon film 90 in the amorphous state is formed in the second step, but in the present embodiment, a silicon germanium (SiGe) film is formed instead of the impurity-containing silicon film 90. The seed film 88 is formed in the first step like the embodiment described above.

Figure 13:
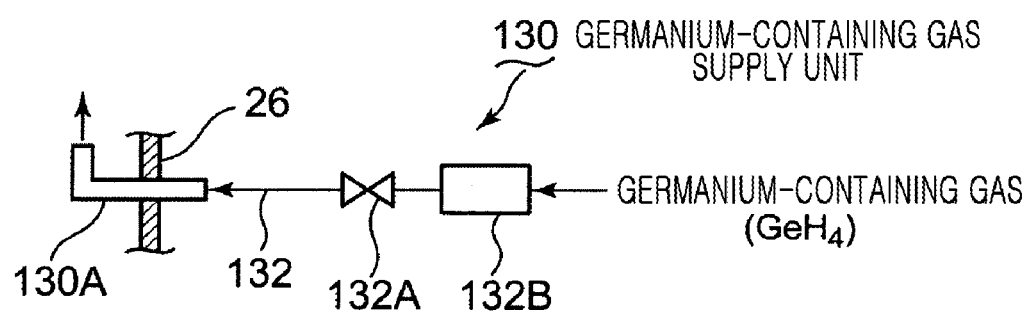
FIG. 13 is a diagram showing a germanium-containing gas supply unit that is a part of another embodiment of a film forming apparatus of the present invention.
Figure 14:
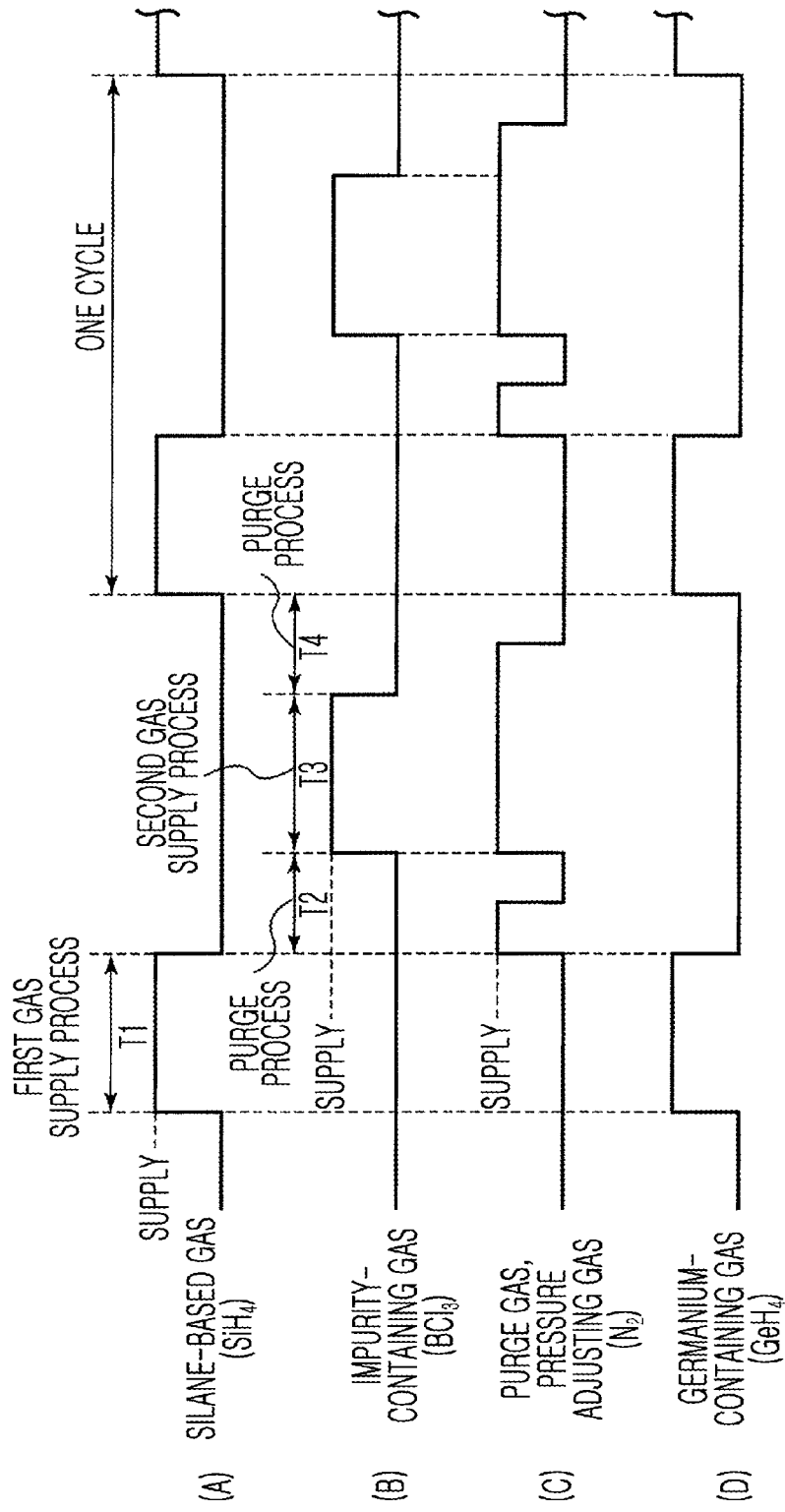
FIG. 14 is a timing chart showing an example of a supply aspect of each gas in a second step of the another embodiment of the present invention.
Figure 15:
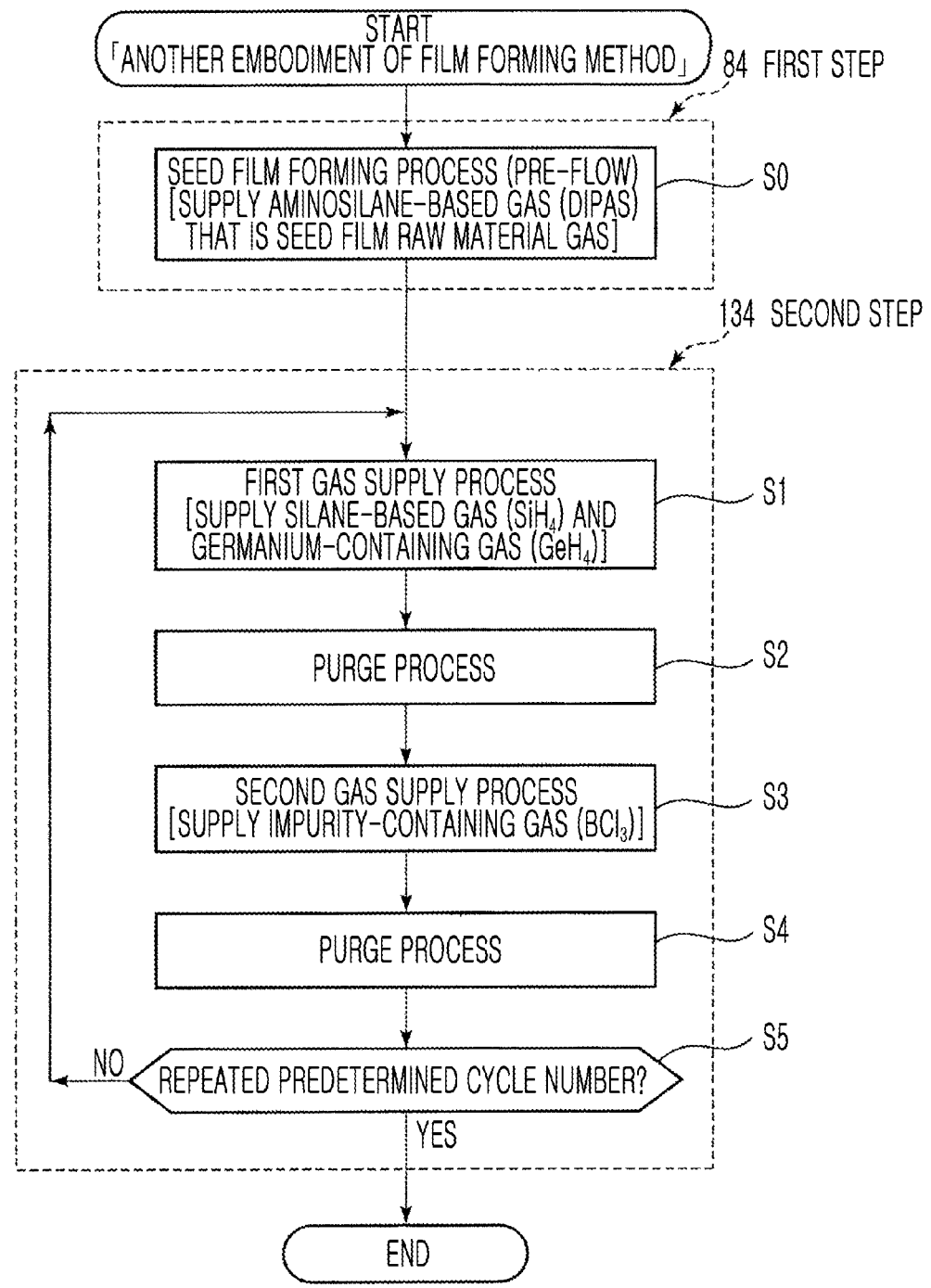
FIG. 15 is a flowchart showing an example of each process of the another embodiment of the film forming method of the present invention.
Figure 16A:
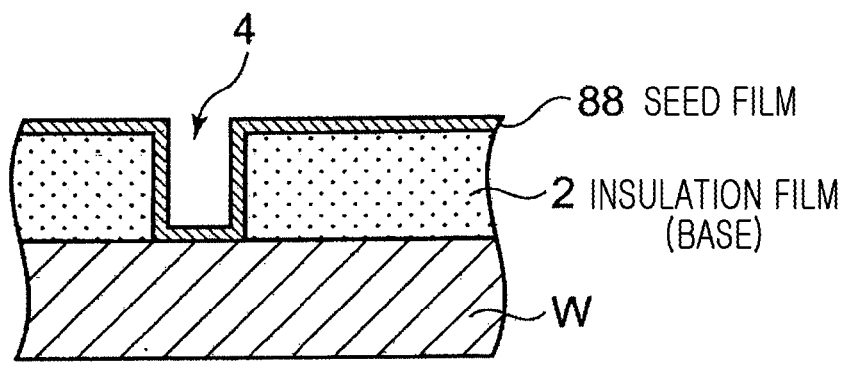
FIGS. 16A and 16B are cross-sectional views showing an example of an object to be processed on which a thin film is formed by the another embodiment of the film forming method of the present invention.
Figure 16B:
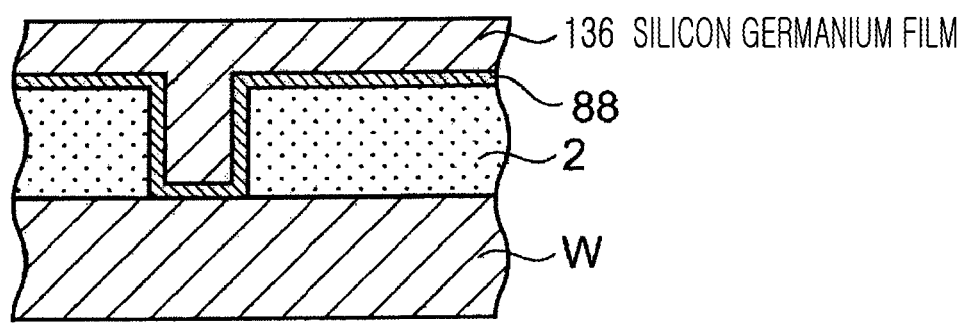

FIG. 13 is a diagram showing a germanium-containing gas supply unit that is a part of the present embodiment of a film forming apparatus of the present invention, FIG. 14 is a timing chart showing an example of a supply aspect of each gas in a second step of the present embodiment of the present invention, FIG. 15 is a flowchart showing an example of each process of the present embodiment of a film forming method of the present invention, and FIGS. 16A and 16B are cross-sectional views showing an example of an object to be processed on which a thin film is formed by the present embodiment of the film forming method of the present invention.

Here, in order to form a SiGe film, a germanium-containing gas supply unit 130 shown in FIG. 13 may be additionally provided to the film forming apparatus 12 described above with reference to FIG. 1. The germanium-containing gas supply unit 130 includes a gas nozzle 130A provided by penetrating through the manifold 26, wherein a gas passage 132 is connected to the gas nozzle 130A while an opening/closing valve 132A and a flow rate controller 132B, such as a mass flow controller, are sequentially provided to the gas passage 132, and thus the germanium-containing gas supply unit 130 flows a germanium-containing gas while a flow rate is controlled. Monogermane ($GeH_4$), for example, is used as the germanium-containing gas, but alternatively, at least one gas selected from the group consisting of monogermane and $Ge_2H_6$ may be used.

Concentration of germanium in the SiGe film may have any value as long as it is higher than 0% and lower than 100%, and may be in a range from 10 to 90%. Also, the SiGe film may or may not include an impurity. When the SiGe film does not include an impurity, the impurity-containing gas supply unit 54 (refer to FIG. 1) is not necessary in an example of a film forming apparatus described above.

<Another Embodiment of Film Forming Method>

A film forming method performed by a film forming apparatus obtained by additionally providing the germanium-containing gas supply unit 130 to the film forming apparatus 12 of FIG. 1, according to the another embodiment, includes the first step 84 which forms a seed film on a surface of an object to be processed by supplying a seed film raw material gas including at least any one of an aminosilane-based gas and a higher silane into the processing container 14, and the second step 134 which forms a SiGe film by supplying a silane-based gas and a germanium-containing gas into the processing container 14.

In this case, an impurity may be or may not be included in the SiGe film as described above. When the SiGe film includes an impurity, two gases, namely, the silane-based gas and the germanium-containing gas, and the impurity-containing gas may be alternately supplied or simultaneously supplied.

First, an example of alternately supplying the two gases, namely, the silane-based gas and the germanium-containing gas, and the impurity-containing gas will now be described. In other words, in the second step, as shown in FIG. 15, an impurity-containing SiGe film is formed by alternately repeatedly performing the first gas supply process (process S1) which supplies the silane-based gas and the germanium-containing gas into the processing container 14 while the silane-based gas and the germanium-containing gas are adsorbed on the surface of the semiconductor wafer W that is the object to be processed, and the second gas supply process (process S3) which supplies the impurity-containing gas into the processing container 14.

In the first step 84, the seed film 88 (refer to FIGS. 16A and 16B) is formed by exactly equally performing the first step 84 of the embodiment shown in FIG. 3. Other processes S2 through S5 of the second step 134 are identical to those of the previous embodiment shown in FIG. 3, except that the germanium-containing gas is flowed in addition to the silane-based gas in the first gas supply process (process S1).

In other words, in the second step 134, as shown in FIG. 14, the germanium-containing gas (refer to (D) of FIG. 14) is simultaneously supplied with the silane-based gas of (A) of FIG. 14 at the same period. Also, supply aspects and modified aspects of the impurity-containing gas ((B) of FIG. 14) and the purge gas and pressure adjusting gas ((C) of FIG. 14) are identical to those described with reference to FIG. 2.

As described above, in the first gas supply process (process S1) of the second step 134, a monosilane gas and a monogermane gas are simultaneously supplied to adsorb on the surface of the semiconductor wafer W. Accordingly, as a result, a B-doped impurity-containing SiGe film 136 is deposited and formed as shown in FIG. 16B. The SiGe film 136 may be amorphous or in a single crystalline or polycrystalline state.

A flow rate of the monogermane gas in the first gas supply process (process S1) of the second step 134 is in a range from 10 to 2000 sccm. A process temperature, a process pressure, and a supply period of time T1 are identical to those in the previous embodiment. For example, a flow rate of the monosilane gas is, for example, in a range from 100 to 4000 sccm, for example, about 1200 sccm, a process pressure is in a range from 27 to 6665 Pa (0.2 to 50 Torr), for example, about 533 Pa (4 Torr), a process temperature is in a range from 350 to 600° C., for example, about 400° C., and the supply period of time T1 is in a range from 1 to 300 seconds, for example, about 60 seconds. Also, the modified embodiments of supply of the $N_2$ gas shown in (D) through (F) of FIG. 2 may also be applied to the present embodiment.

As such, a thin film including a SiGe film 136 (refer to FIG. 16B) having a very thin atom level thickness is deposited on the seed film 88, and thus the recessed portion 4 (refer to FIGS. 16A and 16B) provided on the surface of the semiconductor wafer W may be satisfactorily embedded. Here, as described above, the SiGe film 136 is doped with B as an impurity.

As such, since the thin film forming method which forms the seed film 88 and the SiGe film 136 on a surface of an object to be processed in the processing container 14 configured to be vacuum exhaustible includes performing the first step 84 which forms the seed film 88 on the surface of the object to be processed by supplying a seed film raw material gas including at least any one of an aminosilane-based gas and a higher silane into the processing container 14, and performing the second step which forms the SiGe film 136 by supplying a silane-based gas and a germanium-containing gas into the processing container 14, it is possible to form a SiGe film having a satisfactory embedding characteristic even at a relatively low temperature and improving a precision of surface roughness.

Modified Example 1

In the above embodiment, the silane-based gas and the germanium-containing gas, and the impurity-containing gas are alternately supplied in the second step, but alternatively, the silane-based gas and the germanium-containing gas, and the impurity-containing gas may be simultaneously supplied to form an impurity-containing SiGe film via a CVD method. In this case, regarding process conditions, a flow rate of the silane-based gas (for example, monosilane) is in a range from 100 to 2000 sccm, a flow rate of the germanium-containing gas (for example, monogermane) is in a range from 100 to 2000 sccm, and a flow rate of the impurity-containing gas (for example, $BCl_3$) is in a range from 50 to 500 sccm. Also, a process pressure is in a range from 0.1 to 10 Torr and a process temperature is in a range from 350 to 600° C. Also, a process time is determined based on a film thickness required. In this case, the same effects as the above embodiment may be obtained.

Modified Example 2

In the Modified Example 1, the silane-based gas and the germanium-containing gas, and the impurity-containing gas are simultaneously supplied in the second step, but alternatively, the silane-based gas and the germanium-containing gas may be simultaneously supplied without supplying the impurity-containing gas as described above to form an SiGe film that does not include an impurity via a CVD method. In this case, regarding process conditions, a flow rate of the silane-based gas (for example, monosilane) is in a range from 100 to 2000 sccm and a flow rate of the germanium-containing gas (for example, monogermane) is in a range from 100 to 2000 sccm. Also, a process pressure is in a range from 0.1 to 10 Torr and a process temperature is in a range from 350 to 600° C. Also, a process time is determined based on a film thickness required. In the modified example 2, the impurity-containing gas supply unit 54 (refer to FIG. 1) is not necessary as described above. In this case also, the same effects as the above embodiment may be obtained.

<Evaluation on Another Embodiment of Film Forming Method of Present Invention>

Figure 17:
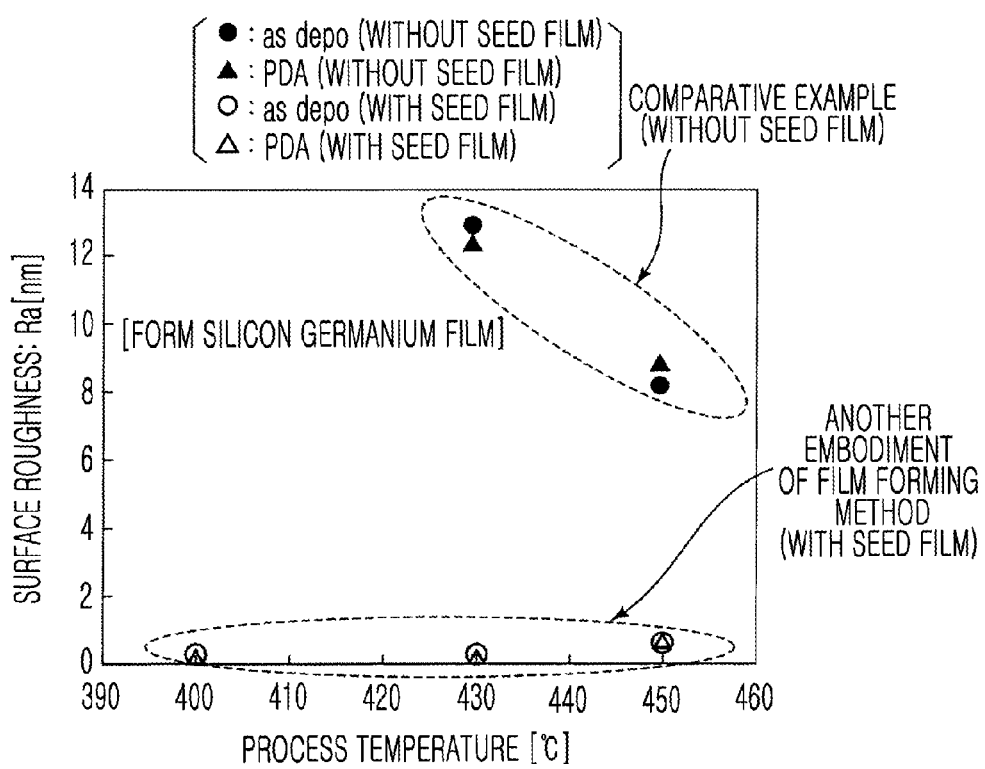
FIG. 17 is a graph showing a result of surface roughness for evaluating the another embodiment of the film forming method of the present invention.
Figure 18:
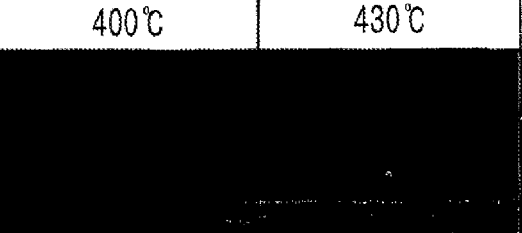
FIG. 18 is photos in place of drawings showing a surface of a silicon germanium film deposited when the another embodiment of the film forming method of the present invention is performed.

Here, the results of evaluating the another embodiment of the film forming method of the present invention described above will now be described. FIG. 17 is a graph showing a result of surface roughness for evaluating the another embodiment of the film forming method of the present invention, and FIG. 18 is photos in place of drawings showing a surface of a SiGe film deposited when the another embodiment of the film forming method of the present invention is performed. Here, a seed film was formed on a silicon oxide film, and a SiGe film that does not include an impurity was formed via CVD film formation on the seed film as in the modified example 2.

Regarding process conditions, the process conditions described above in the present embodiment of the film forming method of the present invention were used. Process temperatures were three points of 400° C., 430° C., and 450° C.

Also, for comparison, a comparative example was obtained by directly forming a SiGe film on a silicon oxide film without forming a seed film. Here, process temperatures were two points of 430° C. and 450° C. "as depo" in FIG. 17 denotes a state immediately after a SeGe film is formed, and "PDA" in FIG. 17 denotes post deposition anneal.

Also, images of FIG. 18 are obtained by using an electron microscope. As shown in FIG. 17, in the comparative example without a seed film, a surface roughness of a SiGe film is high, i.e., equal to or above 8 nm, and as clearly shown in the images of FIG. 18, a surface of the SiGe film is large uneven.

In this regard, in the another embodiment of the film forming method of the present invention with a seed film, surface roughness is very small, i.e., less than or equal to 1 nm throughout 400 to 450° C., and as clearly shown in the images of FIG. 18, a surface is very smooth.

Also, in each embodiment of the film forming method, the $N_2$ gas is intermittently supplied, but alternatively, the $N_2$ gas may be continuously supplied throughout the film forming process such that a pressure does not largely fluctuate.

Also, in each embodiment of the film forming method, the $N_2$ gas is used as the purge gas in each purge process or the pressure adjusting gas in the second gas supply process, but alternatively, a rare gas, such as an Ar or He gas may be used instead of the $N_2$ gas. In addition, in each embodiment, the $N_2$ gas is used as the purge gas in each purge process or the pressure adjusting gas in the second gas supply process, but alternatively, a hydrogen ($H_2$) gas may be used instead of or together with the $N_2$ gas or the rare gas. Specifically, when the $H_2$ gas is used, the $H_2$ gas suppresses migration of silicon, and thus a silicon film or SiGe film is prevented from being atomized and adhered, thereby further improving an embedding characteristic.

Also, in each embodiment of the film forming method, the pressure adjusting gas is supplied mainly in the second gas supply process, but alternatively, the pressure adjusting gas may be supplied in the first supply process instead of or together with the supply of the pressure adjusting gas in the second gas supply process. Also, in each embodiment of the film forming method, monosilane is used as the silane-based gas, but alternatively, at least one gas type selected from the group consisting of a monosilane and a higher silane may be used.

Also, in each embodiment of the film forming method, the $BCl_3$ gas is used to include an impurity (dopant), but alternatively, the impurity-containing gas may be at least one gas type selected from the group consisting of $BCl_3$, $PH_3$, $PF_3$, $AsH_3$, $PCl_3$, and $B_2H_6$, thereby doping various impurities.

Also, when the seed film 88 is thickened, the film thickness of the impurity-containing silicon film 90 in the amorphous state or the film thickness of SiGe film 136 is increased, and thus miniaturization of a semiconductor apparatus is damaged. Also, the seed film 88 is used to uniformly generate nucleus of an impurity-containing silicon in an amorphous state or nucleus of SiGe. Thus, the thickness of the seed film 88 may be thin, and preferably in a monoatomic layer level. In detail, the thickness of the seed film 88 may be from 0.1 to 5.0 nm.

Also, a monovalent aminosilane-based gas, for example, DIPAS, may be used as the aminosilane-based gas. Also, instead of decomposing aminosilane, for example, aminosilane may be adsorbed on the insulation film 2 that is a base. For example, DIPAS is thermally decomposed at a temperature equal to or higher than 450° C. When aminosilane is thermally decomposed, an impurity, such as carbon (C) or nitrogen (N), may be included in a film being formed. Thus, aminosilane is adsorbed on, for example, the insulation film 2 that is a base without being decomposed, and thus an impurity may be suppressed from being included in a film being formed.

Also, the thicknesses of the impurity-containing silicon film 90 in the amorphous state and the thicknesses of SiGe film 136 may be from 1 nm to 100 nm, but alternatively, for example, may be less than or equal to 50 nm and equal to or higher than 1 nm. The film forming method may be performed by simply alternatively supplying two types of gases as described above or by using a so-called atomic layer deposition (ALD) method which deposits a thin film having an atomic level or molecular level thickness. Furthermore, the supply of the silane-based gas may be unsaturated absorption and the supply of the impurity-containing gas may be saturated absorption.

Also, in each embodiment, the aminosilane-based gas is used as the seed film raw material gas in the first step, but alternatively, as described above, at least any one of the aminosilane-based gas and higher silane may be used as the seed film raw material gas. For example, when higher silane is used as the seed film raw material gas (without using the aminosilane-based gas), a process temperature while forming a seed film is, for example, about 400° C., and a thickness of the seed film is about 1 to 2 nm. In this case, a surface roughness of the seed film is relatively satisfactory and is in a continuous film state.

Also, when the aminosilane-based gas is used as the seed film raw material gas (without using the higher silane), since the aminosilane-based gas is used in a range that does not increase a film thickness with respect to a supply time, the seed film may have a film thickness of about 1 molecular layer (about 0.1 to 0.5 nm). A process temperature at this time is, for example, from about 25 to about 550° C., and the seed film may be formed at a low temperature compared to when the seed film is formed by using the higher silane.

Also, in the first step, as described above, the aminosilane-based gas and the higher silane may be used as the seed film raw material gas. In detail, there are an aspect which initially flows the aminosilane-based gas and then flows the higher silane, another aspect which performs one sequence including a process of initially flowing the aminosilane-based gas and a process of then flowing the higher silane, in a plurality of times, and another aspect which simultaneously flows the aminosilane-based gas and the higher silane.

In the aspect, i.e., when the aminosilane-based gas and the higher silane are alternately supplied once, a continuous seed film having satisfactory surface roughness may be obtained compared to a seed film formed via a single flow of higher silane.

Alternatively, in another aspect, i.e., when the aminosilane-based gas and the higher silane are alternately repeatedly supplied in a plurality of times, a continuous seed film thicker than that of the above aspect may be obtained.

Also, in another aspect, i.e., when the aminosilane-based gas and the higher silane are simultaneously supplied, it is possible to form a seed film at a short period of time, and thus productivity is advantageous.

Also, according to the present invention, regarding the higher silane usable in the first and second steps, a hydride of silicon represented by an equation of, for example, $Si_mH_{2m+2}$ (here, "m" is a natural number equal to or higher than 2) may be selected from at least one of disilane ($Si_2H_6$), trisilane ($Si_3H_8$), tetrasilane ($Si_4H_{10}$), pentasilane ($Si_5H_{12}$), hexasilane ($Si_6H_{14}$), and heptasilane ($Si_7H_{16}$).

Also, regarding the higher silane, a hydride of silicon represented by an equation of $Si_nH_{2n}$ (here, "n" is a natural number equal to or higher than 3) may be selected from at least one of cyclotrisilane ($Si_3H_6$), cyclotetrasilane ($Si_4H_8$), cyclopentasilane ($Si_5H_{10}$), cyclohexasilane ($Si_6H_{12}$), and cycloheptasilane ($Si_7H_{14}$).

Here, when the higher silane is used as the seed film raw material gas in the first step, a supply system of a higher silane gas may be provided instead of or together with a supply system of the aminosilane-based gas. Alternatively, when the higher silane is used in both of the first and second steps, for example, one silane-based gas supply unit 52 may be used in both of the first and second steps.

Also, as shown in FIG. 1, the processing container 14 is a single pipe batch type film forming apparatus in one layer, but alternatively, the processing container 14 may be applied to a double chamber batch type film forming apparatus including an inner pipe and an outer chamber. Furthermore, the gas nozzles 52A, 54A, 56A, and 80A are direct pipe type gas nozzles discharging gases only from the leading ends, but alternatively, the gas nozzles 52A, 54A, 56A, and 80A may be so-called dispersal type gas nozzles where a plurality of gas ejection holes are provided at predetermined pitches with respect to a gas pipe disposed along a length direction of the processing container 14, and gases are ejected from each gas ejection hole.

Furthermore, a batch type film forming apparatus which processes a plurality of semiconductor wafers W at once as described above has been described, but alternatively, the present invention may also be applied to a so-called single wafer type film forming apparatus which processes the semiconductor wafer W one-by-one.

Also, a semiconductor wafer has been described as an example of an object to be processed, where the semiconductor wafer includes a silicon substrate or a compound semiconductor substrate, such as GaAs, SiC, or GaN. Alternatively, the present invention may be applied to a glass substrate, a ceramic substrate, or the like, which is used in a liquid crystal display apparatus.

According to the thin film forming method and the film forming apparatus of the present invention, the following excellent effects may be obtained:

According to the embodiment of the present invention, since the thin film forming method which forms a seed film and an impurity-containing silicon film on a surface of an object to be processed in a processing container configured to be vacuum exhaustible includes performing a first step which forms the seed film on the surface of the object to be processed by supplying a seed film raw material gas including at least any one of an aminosilane-based gas and a higher silane into the processing container, and performing a second step which forms the impurity-containing silicon film in an amorphous state by supplying a silane-based gas and an impurity-containing gas into the processing container, it is possible to form the impurity-containing silicon film in the amorphous state having a satisfactory embedding characteristic even at a relatively low temperature and improving a precision of surface roughness.

According to the another embodiment of the present invention, since the thin film forming method which forms a seed film and a silicon germanium film on a surface of an object to be processed in a processing container configured to be vacuum exhaustible includes performing a first step which forms the seed film on the surface of the object to be processed by supplying a seed film raw material gas including at least any one of an aminosilane-based gas and a higher silane into the processing container, and performing a second step which forms the silicon germanium film by supplying a silane-based gas and a germanium-containing gas into the processing container, it is possible to form a silicon germanium film having a satisfactory embedding characteristic even at a relatively low temperature and improving a precision of surface roughness.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A thin film forming method which forms a seed film and an impurity-containing silicon film on a surface of an object to be processed in a processing container configured to be vacuum exhaustible, the thin film forming method comprising:

performing a first step which forms the seed film formed of a compound of silicon, carbon and nitrogen on the surface of the object by supplying a seed film raw material gas comprising an aminosilane-based gas into the processing container; and performing a second step which forms the impurity-containing silicon film in an amorphous state on the seed film by alternately repeatedly performing a first gas supply process which supplies a silane-based gas into the processing container, and a second gas supply process which supplies an impurity-containing gas including at least one gas type selected from the group consisting of $BCl_3$, $PH_3$, $PF_3$, $AsH_3$, $PCl_3$, and $B_2H_6$ into the processing container.

* * * * *